United States Patent
Ran et al.

(10) Patent No.: US 10,666,230 B2
(45) Date of Patent: May 26, 2020

(54) VARIABLE IMPEDANCE COMMUNICATION TERMINAL

(71) Applicant: Intel Corporation, Santa Clara, CA (US)

(72) Inventors: Adee Ofir Ran, Maayan Baruch (IL); Itamar Fredi Levin, Mazkeret Batya (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/116,690

(22) Filed: Aug. 29, 2018

(65) Prior Publication Data

US 2019/0058457 A1 Feb. 21, 2019

Related U.S. Application Data

(60) Provisional application No. 62/551,393, filed on Aug. 29, 2017.

(51) Int. Cl.
| | | |
|---|---|---|
| H04B 14/04 | (2006.01) | |
| H03H 11/28 | (2006.01) | |
| H04B 1/04 | (2006.01) | |
| H03F 1/56 | (2006.01) | |
| H03F 3/24 | (2006.01) | |
| H03F 3/45 | (2006.01) | |
| H03F 3/189 | (2006.01) | |

(52) U.S. Cl.
CPC .............. *H03H 11/28* (2013.01); *H03F 1/56* (2013.01); *H03F 3/189* (2013.01); *H03F 3/24* (2013.01); *H03F 3/45475* (2013.01); *H04B 1/0458* (2013.01); *H03F 2203/45591* (2013.01); *H03F 2203/45686* (2013.01)

(58) Field of Classification Search
CPC ... H03F 1/56; H03F 3/24; H03F 3/189; H03F 3/45475; H03F 2203/45591; H03F 2203/45686; H03H 11/28; H04B 1/0458
See application file for complete search history.

(56) References Cited

U.S. PATENT DOCUMENTS

| | | | | |
|---|---|---|---|---|
| 7,822,022 | B2* | 10/2010 | Heston | H04J 3/1611 370/353 |
| 9,374,174 | B1* | 6/2016 | Hammerschmidt | H04B 14/026 |
| 10,276,220 | B2* | 4/2019 | Jeon | G11C 7/1057 |
| 2006/0209945 | A1* | 9/2006 | Yamaguchi | H04B 3/04 375/232 |
| 2007/0116055 | A1* | 5/2007 | Atsumi | H04J 3/1658 370/476 |
| 2010/0262729 | A1* | 10/2010 | Gaskins | G06F 13/4086 710/32 |
| 2010/0297953 | A1* | 11/2010 | Rofougaran | H04B 7/0689 455/73 |
| 2015/0180538 | A1* | 6/2015 | Smith | H04Q 9/00 375/257 |
| 2017/0201006 | A1* | 7/2017 | Chiu | H04B 1/0458 |

* cited by examiner

*Primary Examiner* — Alexander H Taningco
*Assistant Examiner* — Kurtis R Bahr
(74) *Attorney, Agent, or Firm* — Patent Capital Group

(57) ABSTRACT

There is disclosed in one example an integrated circuit, including: a network protocol circuit to provide communication via a network protocol; a network communication terminal having a configurable impedance; and a control circuit including a control input port, and circuitry to adjust the impedance of the network communication terminal responsive to an input signal.

24 Claims, 13 Drawing Sheets

VARIABLE IMPEDANCE COMMUNICATION TERMINAL

CROSS REFERENCE TO RELATED APPLICATION

This Application claims priority to U.S. Provisional Application 62/551,393, titled "Configurable Terminations in High-Speed Serial Links," filed Aug. 29, 2017, which is incorporated herein by reference.

BACKGROUND

In a modern data center, bandwidth and latency between interconnected elements can be a key performance indicator for the system as a whole.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

EMBODIMENTS OF THE DISCLOSURE

Figure 1:
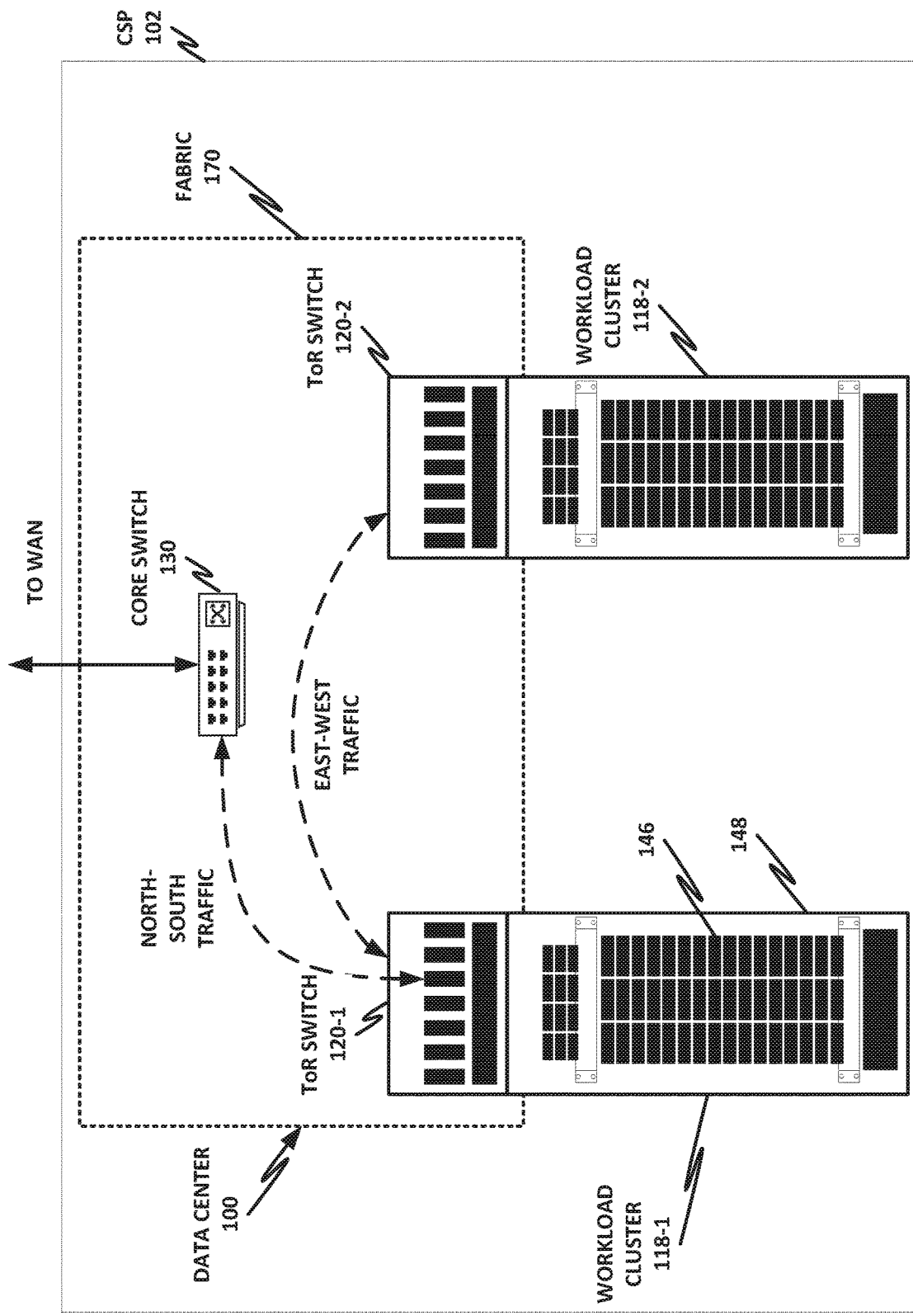
FIG. 1 is a block diagram of selected components of a data center with network connectivity, according to the teachings of the present specification.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

In embodiments of the present disclosure, a processor includes any programmable logic device with an instruction set. Processors may be real or virtualized, local or remote, or in any other configuration. A processor may include, by way of nonlimiting example, an Intel® processor (e.g., Xeon®, Core™, Pentium®, Atom®, Celeron®, x86, or others). A processor may also include competing processors, such as AMD (e.g., Kx-series x86 workalikes, or Athlon, Opteron, or Epyc-series Xeon workalikes), ARM processors, or IBM PowerPC and Power ISA processors, to name just a few.

Impedance matching in transmission lines makes a substantial difference in signal-to-noise ratio and the quality of transmission, and may also bear on equipment safety. Mismatched impedances between transmitter and receiver can result in reflections that appear to the transmitter to be return data, and that cause distortion in the communication. In higher-powered systems, such as radio transmitters, mismatched impedances between the transmitter and the antenna at high power can result in damage to equipment.

Ethernet is one example of a baseband transmission medium that operates over a very broad range of frequencies. A transmitted pulse in the baseband is not modulated. One goal of Ethernet is to transmit the pulse with as little distortion as possible. Good impedance matching between the transmitter and receiver helps to reduce distortion in the channel.

For example, gigabit Ethernet can drive powered signals onto the line at any frequency between DC and approximately 100 MHz, unlike a radio transmission. For example, in a radio transmission, the popular "20-meter" (20 m) amateur radio band covers frequency from 14.000 to 14.350 MHz. So impedance matching on an antenna tuned to 20 m is concerned only with matching impedance across that relatively narrow range of frequencies.

In contrast, an Ethernet transmission medium must match impedance across a very wide band of frequencies. In gigabit Ethernet, the frequency ranges between DC and approximately 100 MHz. The issue is even more acute in multi-gigabit systems. For example, 100 gigabit Ethernet has a transmission spectrum from DC to 30 GHz.

So in Ethernet systems, impedance mismatching may result in substantial inter-symbol interference (ISI), wherein reflected signals may look to a transmitter like responses, but in fact are just noise that must be identified and ignored.

With advanced processing, Ethernet systems can tolerate some reflection. But it has been found at higher speeds that the nominal impedance of 100 ohms at an Ethernet terminal is not always optimal. For example, a system designer may find that lower distortion can be realized at 90 ohms than at the nominal 100 ohms. This 10-ohm variance is within the tolerance of the existing Ethernet standard.

For example, there may be greater signal integrity or higher signal-to-noise ratio (SNR) if the devices at both ends of the channel are tuned to 90 ohms. But these advantages can be lost if one of the devices is mismatched (e.g., if one is at 90 ohms and the other is at the nominal 100 ohms). So it is beneficial to provide a mechanism to enable senders and receivers to provide dynamic impedance matching.

If a system is designed to some impedance other than the nominal 100 ohms of the specification, terminations may be designed to the chosen impedance (e.g., 80 ohms, 85 ohms, or 90 ohms, by way of illustrative and nonlimiting example).

But the engineer designing a terminal may not know at design time what type of system the device will be used in, or if it will be optimized to an off-nominal impedance.

Furthermore, there are some deployments where it is actually advantageous to have a slight impedance mismatch. For example, if the receiver is tuned to 90 ohms, it may be beneficial to tune the transmitter to 85 ohms. This results in some reflected signal, but also provides a higher voltage at the receiver, requiring less gain. This trade-off of reflection for gain may be desirable in a system with sufficiently advanced filtering capabilities, where gain impacts overall performance more than reflection.

In another example, it may be desirable to tune impedance not to some theoretical optimal value, but rather empirically. In this case, it may be desirable to perform an "impedance sweep," trying different impedances, measuring the observed performance at each impedance, and selecting the one that yields the best observed performance.

It is therefore advantageous to provide a communication driver, such as an Ethernet device, having a variable impedance terminal. In one embodiment, the variable impedance terminal may include a solid-state programmable impedance whose value can be programmed in discrete steps by a register. For example, if the impedance has up to four discrete values, a 2-bit field may be used for programming the impedance. With other step sizes, and other step values, other sizes of bit field may be selected to match the available values to the number of steps.

While solid-state and discrete variable resistors are well known, as of this writing, the IEEE P802.3 Ethernet standard provides no standardized way of programming an impedance, or of allowing a device (such as a terminal or orchestrator) to request another device to adjust its impedance to a particular value. The teachings of the present specification provide such a register.

While the teachings of the present specification are illustrated in relation to the IEEE P802.3 Ethernet standard, they should not be understood to be so limited. In a general sense, the teachings of the present specification are applicable to any transmission medium in which it may be beneficial to provide a configurable impedance. These could include, by way of illustrative and nonlimiting example, Ethernet, Firewire, FibreChannel, universal serial bus (USB), USB type C (USB-C), an in-die interconnect (IDI) (e.g., carrying signals between on-chip elements of a system-on-a-chip), optical modules (e.g., for a system-on-a-board), inter-integrated circuit (I2C), or a coherent high-performance computing (HPC) fabric like Intel® Omni-Path™ Architecture (OPA).

Contemporary technology for high-speed communication over distances of more than a few millimeters involves distributed systems including sources (transmitters), loads (receivers), and transmission lines (interconnections). A major obstacle for error-free data transmission is electromagnetic reflections caused by impedance mismatches within the transmission path or between the transmission line and the source/load terminations. These reflections create ISI that can degrade a transmission symbol.

It is customary to design interconnects with homogeneous impedances, and to specify the impedances of the interconnect, source, and load. This helps to minimize reflections. For example, the reference in many existing differential signaling technologies, including Ethernet, is 100-ohm differential impedance. But as described above, there are manufacturing considerations or operational considerations that may make it desirable to design parts and interconnects with other impedances. For example, in peripheral component interconnect express (PCIe) and Thunderbolt interconnects, the de facto standard that has arisen is closer to 85 ohms differential impedance.

Specifications generally include frequency domain return loss measurements of transmitters and receivers, which can disqualify parts if these requirements are not met. The interconnect is sometimes also specified. These return loss measurements were originally driven by power delivery applications, such as microwave waveguides and antennas, optical fibers, connectors, lasers, detectors, and audio loudspeakers. This was based on the maximum power transfer theorem.

In order to enable the use of a serializer/deserializer (SERDES) intellectual property (IP) block in various technologies, and to mitigate fabrication process variations, transmitter and receiver circuits often include configurable termination resistors. The termination may be calibrated by measurement of a precision resistor as a reference. This enables meeting the desired return loss specifications.

But in practice, issues can arise. For example, meeting the return loss specification sometimes actually compromises the signal quality. Thus, as described above, there are several situations where it is beneficial to set the termination to a value that results in worse return loss but better overall performance in terms of SNR and bit error rates.

Examples of reasons for setting a termination to a different value include, by way of nonlimiting example:
1. The actual interconnect may have characteristic impedance different from the standard specification. Using an impedance for the transmitter and receiver other than the nominal impedance may reduce reflections compared to using the standardized nominal impedance.
2. In long interconnect traces, the insertion loss can significantly distort and attenuate the signal reaching the receiver. This may require amplification and equalization in the receiver. Modern receivers, such an adaptive decision feedback equalizer (DFE), have good equalization capabilities that can cope with reflections. But amplifying the signal consumes power, and may cause worse degradation than the reflections (such as reduced bandwidth and additive noise). Using a high impedance at the receiver and/or lower impedance in the transmitter may increase the signal level (voltage) available to the receiver and reduce the amplification requirements. The reflections caused by mismatched impedances may be handled by equalization, of which the receiver is already capable. Note that when a signal is fed to an active amplifier, the optimization criteria may be other than the maximum power transfer. Efficiency may be increased by having load impedance higher than the source impedance.

Many existing communication standards, including the current IEEE P802.3 Ethernet standard, do not include provisions for modifying the termination impedance dynamically. Well-engineered systems may use deliberately different values for terminations, but as is often the case, when the transmitter and receiver come from different vendors (e.g., the interconnect vendor may be different from the system integrator) there is currently no standardized way to tune the system for best performance. Furthermore, there is no method for dynamically tuning the termination of the transmitter based on signal quality available to the receiver.

The present specification provides a set of standard registers for setting the terminations of the transmitter and the receiver in a SERDES. This disclosure also specifies a protocol by which the receiver can request the transmitter to increase or decrease its source impedance. Further embodiments specify a test method to verify that the actual impedance matches the requested impedance within a tolerance range. There is also provided herein an algorithm based on gain range, signal quality, or other metrics, implemented in the receiver, to tune the receiver impedance and/or create requests (using the above specified protocol) to the transmitter to tune its impedance.

This enables the use of standardized configurable impedances, and enables improvements in the power, performance, and area (PPA) metrics of a SERDES. This also enables more design flexibility in systems using the SERDES.

Using a standardized protocol for tuning the transmitter impedance, together with an adaptive algorithm, enables performance optimization on a per-link basis. This also reduces the time required to find a single setting that would work on multiple instances of the same designs in different operating conditions.

A system and method for providing a variable impedance communication terminal will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

FIG. 1 is a block diagram of selected components of a data center 100 with network connectivity.

A contemporary computing platform may include a complex and multi-faceted hardware platform provided by Intel®, another vendor, or combinations of different hardware from different vendors. For example, in a large data center such as may be provided by a cloud service provider (CSP), an HPC cluster, or the hardware platform may include rack-mounted servers with compute resources such as processors, memory, storage pools, accelerators, and other similar resources. As used herein, "cloud computing" includes network-connected computing resources and technology that enables ubiquitous (often worldwide) access to data, resources, and/or technology. Cloud resources are generally characterized by flexibility to dynamically assign resources according to current workloads and needs. This can be accomplished, for example, by assigning a compute workload to a guest device, wherein resources such as hardware, storage, and networks are provided to a virtual machine, container, or disaggregated node by way of nonlimiting example. Many of the elements disclosed in FIG. 1 may benefit from configurable impedances in their communications terminals.

For example, within a workload cluster 118, individual servers 146 may communicate with one another via a networking protocol such as Ethernet, by way of nonlimiting example. Top-of-rack (ToR) switches 120 may communicate with one another and with core switch 130 via Ethernet or fiber optic protocols. Furthermore, within individual servers 146, components such as a system-on-a-chip or a system-on-a-board may include internal communications between various elements. Any one of these could benefit from having a SERDES or physical media dependent (PMD) that communicates with a physical media attachment (PMA) having a configurable impedance.

There are many known variable or configurable impedance elements in the art, and various interconnects, whether on-board, between boards, or on an application-specific integrated circuit (ASIC), by way of nonlimiting example, can all benefit from having this configurable impedance on the PMA, where it's controlled by the PMD.

Data center 100 is disclosed in FIG. 1 as a data center operated by a CSP 102, but this is an illustrative example only. The principles illustrated herein may also be applicable to an HPC cluster, a smaller "edge" data center, a microcloud, or other interconnected compute structure.

CSP 102 may be, by way of nonlimiting example, a traditional enterprise data center, an enterprise "private cloud," or a "public cloud," providing services such as infrastructure as a service (IaaS), platform as a service (PaaS), or software as a service (SaaS). In some cases, CSP 102 may provide, instead of or in addition to cloud services, HPC platforms or services. Indeed, while not expressly identical, HPC clusters ("supercomputers") may be structurally similar to cloud data centers, and unless expressly specified, the teachings of this specification may be applied to either. In general usage, the "cloud" is considered to be separate from an enterprise data center. Whereas an enterprise data center may be owned and operated on-site by an enterprise, a CSP provides third-party compute services to a plurality of "tenants." Each tenant may be a separate user or enterprise, and may have its own allocated resources, service level agreements (SLAB), and similar.

CSP 102 may provision some number of workload clusters 118, which may be clusters of individual servers, blade servers, rackmount servers, or any other suitable server topology. In this illustrative example, two workload clusters, 118-1 and 118-2 are shown, each providing rackmount servers 146 in a chassis 148.

In this illustration, workload clusters 118 are shown as modular workload clusters conforming to the rack unit ("U") standard, in which a standard rack, 19 inches wide, may accommodate up to 42 units (42U), each 1.75 inches high and approximately 36 inches deep. In this case, compute resources such as processors, memory, storage, accelerators, and switches may fit into some multiple of rack units from 1U to 42U.

Figure 11:
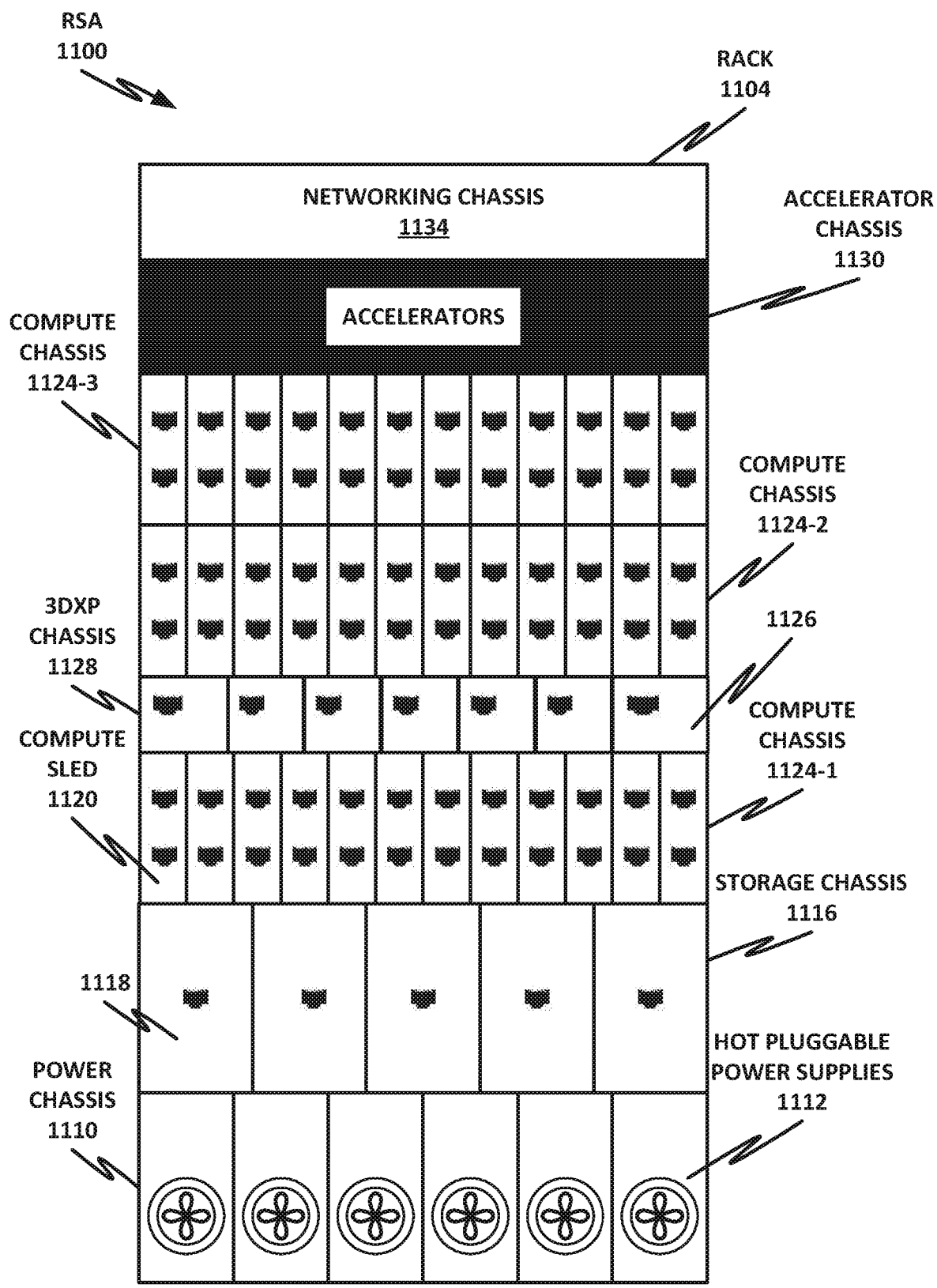
FIG. 11 is a block diagram of rack scale a design, according to the teachings of the present specification.

However, other embodiments are also contemplated. For example, FIG. 11 illustrates rack scale design (RSD). In RSD, a rack may be built according to the standard 42U dimensions, but it may be configured to accommodate line-replaceable units (LRUs) in compute "sleds." In RSD, a sled chassis may or may not be built according to standard rack units. For example, a sled to accommodate processors may fit in a standard 3U configuration, or it may be of an arbitrary size according to preferential design considerations. In RSD, entire pre-populated racks of resources may be provided as a unit, with the rack hosting a plurality of resource sleds, containing such elements as compute (e.g., processors), memory, storage, accelerators, power, networking, and others. Each sled chassis may accommodate a number of LRUs, each embodied in an individual sled. If a resource fails, the LRU hosting that resource can be pulled, and a new one can be modularly inserted. The failed LRU can then be repaired or discarded, depending on the nature of the failure. RSD is especially, though not exclusively, beneficial in the case of software-defined infrastructure (SDI), wherein composite nodes may be built from disaggregated resources. Large resource pools can be provided, and an SDI orchestrator may allocate them to composite nodes as necessary.

In the case of a more traditional rack-based data center, each server 146 may host a standalone operating system and provide a server function, or servers may be virtualized, in which case they may be under the control of a virtual machine manager (VMM), hypervisor, and/or orchestrator. Each server may then host one or more virtual machines, virtual servers, or virtual appliances. These server racks may be collocated in a single data center, or may be located in different geographic data centers. Depending on contractual agreements, some servers 146 may be specifically dedicated to certain enterprise clients or tenants, while others may be shared.

The various devices in a data center may be connected to each other via a switching fabric 170, which may include one or more high-speed routing and/or switching devices. Switching fabric 170 may provide both "north-south" traffic (e.g., traffic to and from the wide area network (WAN), such as the Internet), and "east-west" traffic (e.g., traffic across the data center). Historically, north-south traffic accounted for the bulk of network traffic, but as web services become more complex and distributed, the volume of east-west traffic has risen. In many data centers, east-west traffic now accounts for the majority of traffic.

Furthermore, as the capability of each server 146 increases, traffic volume may further increase. For example, each server 146 may provide multiple processor slots, with each slot accommodating a processor having four to eight cores, along with sufficient memory for the cores. Thus, each server may host a number of virtual machines (VMs), each generating its own traffic.

To accommodate the large volume of traffic in a data center, a highly capable switching fabric 170 may be provided. As used throughout this specification, a "fabric" should be broadly understood to include any combination of physical interconnects, protocols, media, and support resources that provide communication between one or more first discrete devices and one or more second discrete devices. Fabrics may be one-to-one, one-to-many, many-to-one, or many-to-many.

In some embodiments, fabric 170 may provide communication services on various "layers," as outlined in the Open Systems Interconnection (OSI) seven-layer network model. In contemporary practice, the OSI model is not followed strictly. In general terms, layers 1 and 2 are often called the "Ethernet" layer (though in some data centers or supercomputers, Ethernet may be supplanted or supplemented by newer technologies). Layers 3 and 4 are often referred to as the transmission control protocol/internet protocol (TCP/IP) layer (which may be further subdivided into TCP and IP layers). Layers 5-7 may be referred to as the "application layer." These layer definitions are disclosed as a useful framework, but are intended to be nonlimiting.

Switching fabric 170 is illustrated in this example as a "flat" network, wherein each server 146 may have a direct connection to a ToR switch 120 (e.g., a "star" configuration). Note that ToR is a common and historical name, and ToR switch 120 may, in fact, be located anywhere on the rack. Some data centers place ToR switch 120 in the middle of the rack to reduce the average overall cable length.

Each ToR switch 120 may couple to a core switch 130. This two-tier flat network architecture is shown only as an illustrative example. In other examples, other architectures may be used, such as three-tier star or leaf-spine (also called "fat tree" topologies) based on the "Clos" architecture, hub-and-spoke topologies, mesh topologies, ring topologies, or 3-D mesh topologies, by way of nonlimiting example.

The fabric itself may be provided by any suitable interconnect. For example, each server 146 may include an Intel® Host Fabric Interface (HFI), a network interface card (NIC), intelligent NIC (iNIC), smart NIC, a host channel adapter (HCA), or other host interface. For simplicity and unity, these may be referred to throughout this specification as a "network card," which should be broadly construed as an interface to communicatively couple the host to the data center fabric. The network card may couple to one or more host processors via an interconnect or bus, such as PCI, PCIe, or similar, referred to herein as a "local fabric." Multiple processors may communicate with one another via a special interconnect such as a core-to-core Ultra Path Interconnect (UPI), Infinity Fabric, or any suitable inter-processor interconnect for ARM, IBM PowerPC, or Power ISA processors, to name just a few. Generically, these interconnects may be referred to as an "inter-processor fabric." The treatment of these various fabrics may vary from vendor to vendor and from architecture to architecture. In some cases, one or both of the local fabric and the inter-processor fabric may be treated as part of the larger data center fabric 172. Some network cards have the capability to dynamically handle a physical connection with a plurality of protocols (e.g., either Ethernet or PCIe, depending on the context), in which case PCIe connections to other parts of a rack may usefully be treated as part of fabric 172. In other embodiments, PCIe is used exclusively within a local node, sled, or sled chassis, in which case it may not be logical to treat the local fabric as part of data center fabric 172. In yet other embodiments, it is more logically to treat the inter-processor fabric as part of the secure domain of the processor complex, and thus treat it separately from the local fabric and/or data center fabric 172. In particular, the inter-processor fabric may be cache and/or memory-coherent, meaning that coherent devices can map to the same memory address space, with each treating that address space as its own local address space. Many data center fabrics and local fabrics lack coherency, and so it may be beneficial to treat inter-processor fabric, the local fabric, and the data center fabric as one cohesive fabric, or two or three separate fabrics. Furthermore, the illustration of three levels of fabric in this example should not be construed to exclude more or fewer levels of fabrics, or the mixture of other kinds of fabrics. For example, many data centers use copper interconnects for short communication distances, and fiberoptic interconnects for longer distances.

Thus, fabric 170 may be provided by a single interconnect or a hybrid interconnect, such as where PCIe provides on-chip (for a system-on-a-chip) or on-board communication, 1 Gb or 10 Gb copper Ethernet provides relatively short connections to a ToR switch 120, and optical cabling provides relatively longer connections to core switch 130. Interconnect technologies that may be found in the data center include, by way of nonlimiting example, Intel® silicon photonics, an Intel® HFI, a NIC, intelligent NIC (iNIC), smart NIC, an HCA or other host interface, PCI, PCIe, a core-to-core UPI (formerly called QPI or KTI), Infinity Fabric, Intel® Omni-Path™ Architecture (OPA), TrueScale™, FibreChannel, Ethernet, FibreChannel over Ethernet (FCoE), InfiniBand, a legacy interconnect such as a local area network (LAN), a token ring network, a synchronous optical network (SONET), an asynchronous transfer mode (ATM) network, a wireless network such as Wi-Fi or Bluetooth, a "plain old telephone system" (POTS) interconnect or similar, a multi-drop bus, a mesh interconnect, a point-to-point interconnect, a serial interconnect, a parallel bus, a coherent (e.g., cache coherent) bus, a layered protocol architecture, a differential bus, or a Gunning transceiver logic (GTL) bus, to name just a few. The fabric may be cache- and memory-coherent, cache- and memory-non-coherent, or a hybrid of coherent and non-coherent interconnects. Some interconnects are more popular for certain purposes or functions than others, and selecting an appropriate fabric for the instant application is an exercise of ordinary skill. For example, OPA and InfiniBand are commonly used in HPC applications, while Ethernet and Fibre-Channel are more popular in cloud data centers. But these examples are expressly nonlimiting, and as data centers evolve fabric technologies similarly evolve.

Note that while high-end fabrics such as OPA are provided herein by way of illustration, more generally, fabric 170 may be any suitable interconnect or bus for the particular application. This could, in some cases, include legacy interconnects like LANs, token ring networks, synchronous optical networks (SONET), ATM networks, wireless networks such as Wi-Fi and Bluetooth, POTS interconnects, or similar. It is also expressly anticipated that in the future, new network technologies may arise to supplement or replace some of those listed here, and any such future network topologies and technologies can be or form a part of fabric 170.

Figure 2:
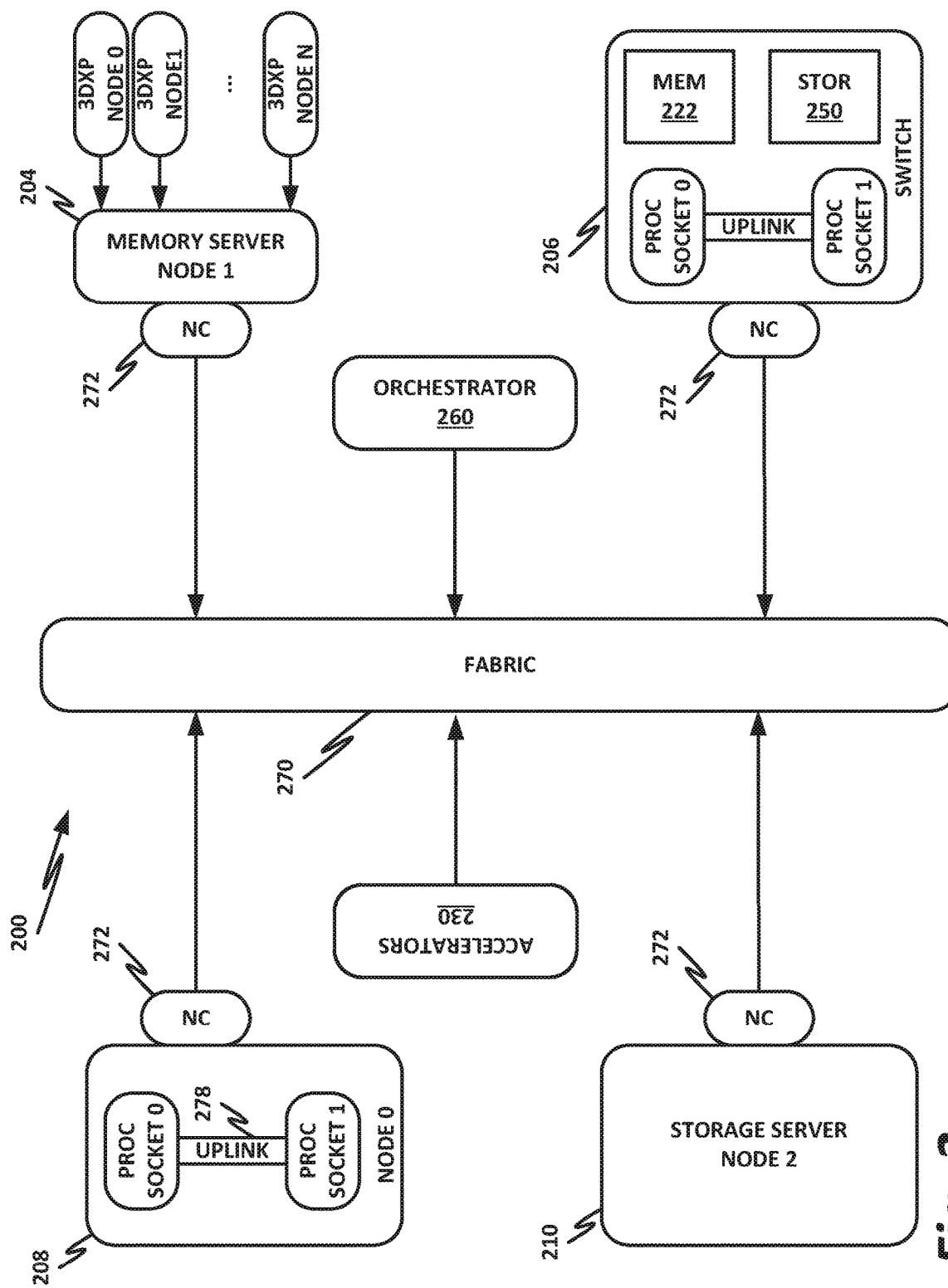
FIG. 2 is a block diagram of selected components of an end-user computing device, according to the teachings of the present specification.

FIG. 2 is a block diagram of an end-user computing device 200. As above, computing device 200 may provide, as appropriate, cloud service, HPC, telecommunication services, enterprise data center services, or any other compute services that benefit from a computing device 200.

In this example, a fabric 270 is provided to interconnect various aspects of computing device 200. Fabric 270 may be the same as fabric 170 of FIG. 1, or may be a different fabric. As above, fabric 270 may be provided by any suitable interconnect technology. In this example, Intel® Omni-Path™ is used as an illustrative and nonlimiting example.

As illustrated, computing device 200 includes a number of logic elements forming a plurality of nodes. It should be understood that each node may be provided by a physical server, a group of servers, or other hardware. Each server may be running one or more VMs as appropriate to its application.

Nodes, such as 206 and 208, may communicate via fabric 270. Each node 206, 208 has a network controller 272, and network controllers 272 may have a point-to-point connection to one another via fabric 270. In other cases, a node such as node 206 may communicate via network controller 272 with a terminal such as a switch or a router, which forms the point-to-point connection. In any connection between elements communicating via fabric 270, it may be desirable to provide a variable impedance so that the transmitter and receiver can negotiate an optimal impedance for the connection. These impedances can either be negotiated directly by the network controllers at either end of the communication, or they may be provided by a management entity such as orchestrator 260. Note that orchestrator 260 is provided only as an illustration of an element that could be used to control impedances between elements, and in other cases, other functions could be used, such as a software-defined network (SDN) controller, a VMM, or other logical device.

Node 0 208 is a processing node including a processor socket 0 and processor socket 1. The processors may be, for example, Intel® Xeon™ processors with a plurality of cores, such as 4 or 8 cores. Node 0 208 may be configured to provide network or workload functions, such as by hosting a plurality of VMs or virtual appliances.

On-board communication between processor socket 0 and processor socket 1 may be provided by an on-board uplink 278. This may provide a very high-speed, short-length interconnect between the two processor sockets, so that VMs running on node 0 208 can communicate with one another at very high speeds. To facilitate this communication, a virtual switch (vSwitch) may be provisioned on node 0 208, which may be considered to be part of fabric 270.

Node 0 208 connects to fabric 270 via a network controller (NC) 272. NC 272 provides a PHY (i.e., physical layer) interface and logic to communicatively couple a device to a fabric. For example, NC 272 may be a NIC to communicatively couple to an Ethernet fabric or an HFI to communicatively couple to a clustering fabric such as an Intel® Omni-Path™, or an InfiniBand controller, by way of illustrative and nonlimiting example. In some examples, communication with fabric 270 may be tunneled, such as by providing UPI tunneling over Omni-Path™.

Because computing device 200 may provide many functions in a distributed fashion that in previous generations were provided on-board, a highly capable NC 272 may be provided. NC 272 may operate at speeds of multiple gigabits per second, and in some cases may be tightly coupled with node 0 208. For example, in some embodiments, the logic for NC 272 is integrated directly with the processors on a system-on-a-chip (SoC). This provides very high-speed communication between NC 272 and the processor sockets, without the need for intermediary bus devices, which may introduce additional latency into the fabric. However, this is not to imply that embodiments where NC 272 is provided over a traditional bus are to be excluded. Rather, it is expressly anticipated that in some examples, NC 272 may be provided on a bus, such as a PCIe bus, which is a serialized version of PCI that provides higher speeds than traditional PCI. Throughout computing device 200, various nodes may provide different types of NCs 272, such as on-board NCs and plug-in NCs. It should also be noted that certain blocks in an SoC may be provided as IP blocks that can be "dropped" into an integrated circuit as a modular unit. Thus, NC 272 may in some cases be derived from such an IP block.

Note that in "the network is the device" fashion, node 0 208 may provide limited or no on-board memory or storage. Rather, node 0 208 may rely primarily on distributed services, such as a memory server and a networked storage server. On-board, node 0 208 may provide only sufficient memory and storage to bootstrap the device and get it communicating with fabric 270. This kind of distributed architecture is possible because of the very high speeds of contemporary data centers, and may be advantageous because there is no need to over-provision resources for each node. Rather, a large pool of high-speed or specialized memory may be dynamically provisioned between a number of nodes, so that each node has access to a large pool of resources, but those resources do not sit idle when that particular node does not need them.

In this example, a node 1 memory server 204 and a node 2 storage server 210 provide the operational memory and storage capabilities of node 0 208. For example, memory server node 1 204 may provide remote direct memory access (RDMA), whereby node 0 208 may access memory resources on node 1 204 via fabric 270 in a direct memory access fashion, similar to how it would access its own on-board memory. The memory provided by memory server 204 may be traditional memory, such as double data rate type 3 (DDR3) dynamic random access memory (DRAM), which is volatile, or may be a more exotic type of memory, such as a persistent fast memory (PFM) like Intel® 3D Crosspoint™ (3DXP), which operates at DRAM-like speeds, but is non-volatile.

Similarly, rather than providing an on-board hard disk for node 0 208, a storage server node 2 210 may be provided. Storage server 210 may provide a networked bunch of disks (NBOD), PFM, redundant array of independent disks (RAID), redundant array of independent nodes (RAIN), network-attached storage (NAS), optical storage, tape drives, or other non-volatile memory solutions.

Thus, in performing its designated function, node 0 208 may access memory from memory server 204 and store results on storage provided by storage server 210. Each of these devices couples to fabric 270 via an NC 272, which provides fast communication that makes these technologies possible.

By way of further illustration, node 3 206 is also depicted. Node 3 206 also includes an NC 272, along with two processor sockets internally connected by an uplink. However, unlike node 0 208, node 3 206 includes its own on-board memory 222 and storage 250. Thus, node 3 206 may be configured to perform its functions primarily on-board, and may not be required to rely upon memory server 204 and storage server 210. However, in appropriate circumstances, node 3 206 may supplement its own on-board memory 222 and storage 250 with distributed resources similar to node 0 208.

Computing device 200 may also include accelerators 230. These may provide various accelerated functions, including hardware or co-processor acceleration for functions such as packet processing, encryption, decryption, compression, decompression, network security, or other accelerated functions in the data center. In some examples, accelerators 230 may include deep learning accelerators that may be directly attached to one or more cores in nodes such as node 0 208 or node 3 206. Examples of such accelerators can include, by way of nonlimiting example, Intel® QuickData Technology (QDT), Intel® QuickAssist Technology (QAT), Intel® Direct Cache Access (DCA), Intel® Extended Message Signaled Interrupt (MSI-X), Intel® Receive Side Coalescing (RSC), and other acceleration technologies.

In other embodiments, an accelerator could also be provided as an ASIC, field-programmable gate array (FPGA), co-processor, graphics processing unit (GPU), digital signal processor (DSP), or other processing entity, which may optionally be tuned or configured to provide the accelerator function.

The basic building block of the various components disclosed herein may be referred to as "logic elements." Logic elements may include hardware (including, for example, a software-programmable processor, an ASIC, or an FPGA), external hardware (digital, analog, or mixed-signal), software, reciprocating software, services, drivers, interfaces, components, modules, algorithms, sensors, components, firmware, microcode, programmable logic, or objects that can coordinate to achieve a logical operation. Furthermore, some logic elements are provided by a tangible, non-transitory computer-readable medium having stored thereon executable instructions for instructing a processor to perform a certain task. Such a non-transitory medium could include, for example, a hard disk, solid-state memory or disk, read-only memory (ROM), PFM (e.g., Intel® 3D Crosspoint™), external storage, RAID, RAIN, NAS, optical storage, tape drive, backup system, cloud storage, or any combination of the foregoing by way of nonlimiting example. Such a medium could also include instructions programmed into an FPGA, or encoded in hardware on an ASIC or processor.

Figure 3:
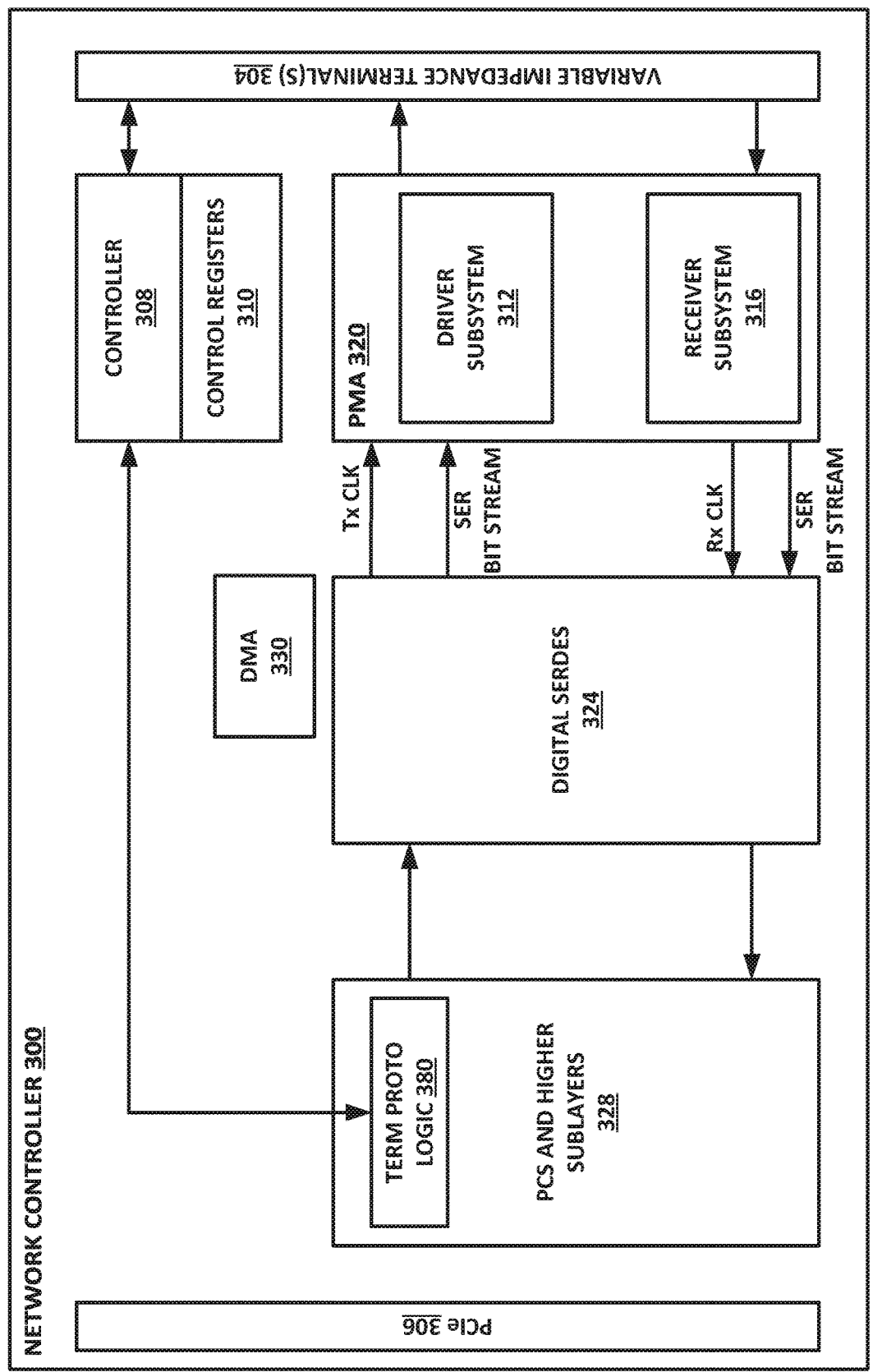
FIG. 3 is a block diagram of a network controller, according to the teachings of the present specification.

FIG. 3 is a block diagram of a network controller 300, according to the teachings of the present specification. Network controller 300 may be an Ethernet NIC, a different NIC, an InfiniBand controller, an HFI, or some other controller for communication between a host device and a network. As discussed above, network controller 300 may be configured with a variable impedance, and may also be configured to interface with other network controllers that have variable impedances.

By way of illustrative example, network controller 300 includes a PCIe interface 306 to communicatively couple to a host device, as well as a direct memory access (DMA) controller 330 to provide direct memory access functions.

Figure 5:
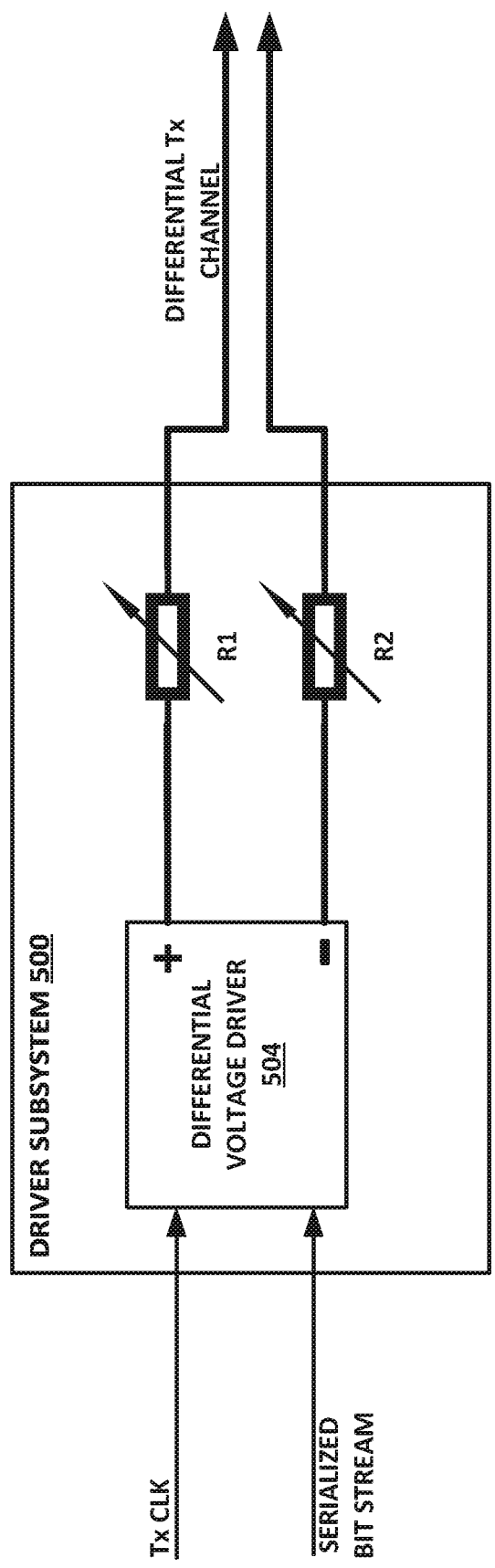
FIG. 5 is a block diagram of a driver subsystem, according to the teachings of the present specification.
Figure 6:
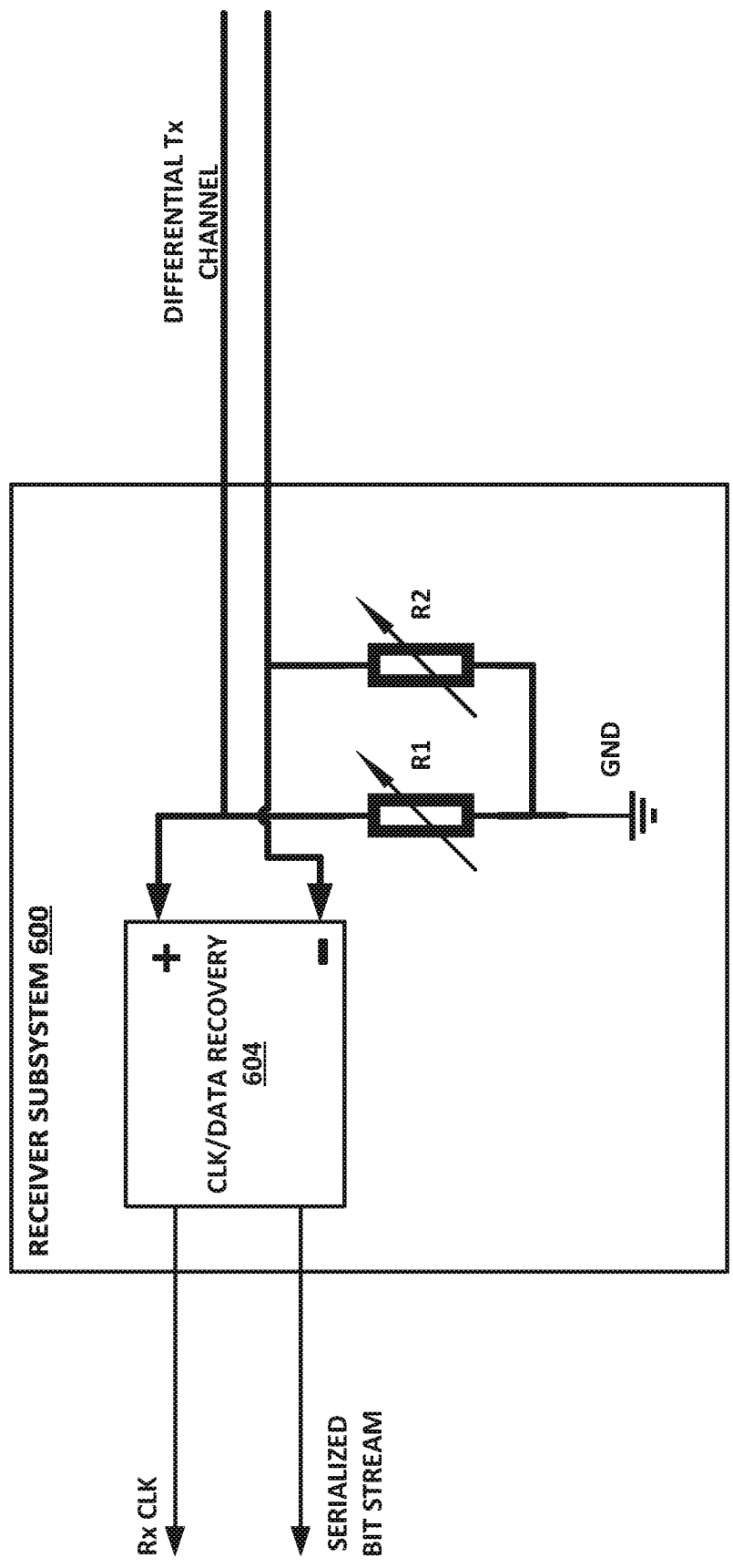
FIG. 6 is a block diagram of receiver subsystem, according to the teachings of the present specification.

Network controller 300 also includes variable impedance terminal(s) 304. Variable impedance terminal(s) 304 may in some cases include separate send and receive impedances, with means for separately controlling the send and receive impedances. For example, FIG. 5 below illustrates a driver subsystem 500 with a configurable send impedance, while FIG. 6 illustrates a receiver subsystem 600 with a configurable receive impedance. FIGS. 5 and 6 show only one differential lane per device. Those illustrations should be understood only as nonlimiting examples, and it is noted here that many different configurations are possible for providing a PMA with configurable send and/or receive impedances. Implementations may have one or more lanes in each subsystem, with possibly separate termination controls for each. The transmitter and receiver may have two or more possible levels, such as non-return-to-zero (NRZ), pulse amplitude modulation 4 (PAM4), or similar. On the NRZ level, which commonly refers to two-level signaling (wherein levels are typically marked as −1 and +1 or −V and +V, etc.), the differential signal alternates between positive and negative values without returning to zero after each symbol. The PAM4 (or 4-PAM) level provides for four possible levels, equally spaced (usually marked as −3, −1, +1, +3, or similar). In various embodiments, other pulse amplitude modulations may be provided with NRZ functionality, as appropriate.

FIGS. 5 and 6 illustrate the driver and clock/data recovery schematically with details omitted. Any suitable implementation may be used. For example, the driver may be implemented as a current driver rather than a voltage driver, and may thus have a different termination circuit. The receiver may terminate to a node that is not ground, and may include capacitive and/or inductive coupling circuits in addition to the resistive circuits shown. Furthermore, it is not necessary to have a configurable send and receive impedance in all cases. For example, in some cases a device may have a fixed transmit impedance, while it includes a variable receive impedance so that a link partner can configure the receive impedance for impedance matching. Similarly, variable impedance terminal(s) 304 could include a variable transmit impedance, but have a fixed receive impedance. Furthermore, network controller 300 may include means, such as a register containing a flag, to indicate to a partner in a communication transaction that network controller 300 supports one or more variable or configurable impedances.

Network controller 300 also includes a PMA 320, which includes a driver subsystem 312 and a receiver subsystem 316. An illustration of a driver subsystem is shown in FIG. 5 as driver subsystem 500. This illustration is provided by way of nonlimiting example, only. An illustration of a receiver subsystem is provided in FIG. 6 as receiver subsystem 600. This illustration should also be understood and viewed as a nonlimiting example, only.

Network controller 300 also includes a digital SERDES 324 and PCS and higher sublayers 328. Digital SERDES 324 serializes and deserializes bit streams to and from PMA 320. When network controller 300 has outgoing data to process, digital SERDES 324 receives digital data from PCS and higher sublayers 328. Digital SERDES 324 then serializes the bitstream and generates a clock, so that serial bitstream and the transmit clock can be output to PMA 320. PMA 320 can then drive the data out via driver subsystem 312.

Similarly, when incoming data are received from the link partner, the data are received at receiver subsystem 316, which then sends a serial bitstream along with the received clock to digital SERDES 324. Digital SERDES 324 recovers the received clock and the serialized bitstream. Digital SERDES 324 then deserializes the bitstream, and drives the data to PCS and higher sublayers 328.

As is further illustrated in FIG. 3, PCS and higher sublayers 328 may include termination protocol logic, which can be used to interface with controller 308 to select receive and/or transmit impedances for network controller 300.

Network controller 300 also includes a controller 308, which in this example includes one or more control registers 310. Controller 308 may include circuitry and/or logic to control the impedance of variable impedance terminals 304. For example, the state of registers within control registers 310 may be used to determine a desired transmit or receive impedance for variable impedance terminals 304, and controller 308 may then issue control signals or voltages to cause variable impedance terminals 304 to assume the appropriate impedance state.

By way of example, control registers 310 may include a plurality of presets for impedances. These can include, for example, 85, 90, 95, or 100 ohms if network controller 300 is an Ethernet controller with a nominal 100-ohm impedance. Other values may be selected, as appropriate. For example, in an Ethernet system, it may be desirable to select any impedance between approximately 80 and 110 ohms. Furthermore, control registers 310 need not necessarily include a number of presets. In other cases, control registers 310 could instruct controller 308 to increment or decrement the impedance by some amount, such as in an impedance sweep, wherein two partner devices are seeking to find an optimal impedance at which to operate.

Control registers 310 effectively provide an application programming interface (API) for partner devices or orchestrators to broker an optimal impedance between two devices. In some cases, control registers 310 include read/write registers that can be directly manipulated by a partner, or more commonly, by an orchestrator to directly instruct network controller 300 to assume a certain terminal impedance. In other cases, control registers 310 may provide an interface for an external device such as a partner or an orchestrator to request network controller 300 to assume a specific impedance.

Control registers 310 may include standardized registers for controlling receiver and transmitter impedance. For example, in an embodiment where network controller 300 is an Ethernet controller, registers may be specified according to an Ethernet standard including, for example, IEEE standard P802.3bs-2017 or amendments thereto, including amendment P802.3cd (draft 2.1) or later drafts.

Ethernet specifies many registers for setting various transmitter and receiver characteristics. For example, IEEE P802.3cd includes a receiver precoder on each lane that can be enabled or disabled using register 601.

As another example, the transmitter equalization coefficients can be controlled by register 184. This register contains bits that allow a management entity to inform the device of its link partner's transmitter equalization coefficients. The bits allow a device to inform a management entity that it would like to change the link partner's transmitter equalization coefficients.

In embodiments of this specification, control registers 310 may be any suitable register, including an IEEE P802.3 standard register. Currently, the IEEE P802.3 standard specifies approximately 2,309 registers numbered from 0 to 2,308 in a 15-bit address space with a total of 32,768 reserved registers numbered between 0 and 32,767. A 16th bit of the register address space doubles the address space to 65,536 total registers between 0 and 65,535. Thus, as of this writing, registers between 2,309 and 32,767 are reserved, while registers between 32,768 and 65,535 are allocated for vendor-specific registers.

In cases where control registers 310 allocate one or more new registers, those registers may be of any integer value between 0 and 65,535, and in particular any number between 2,309 and 32,767 if P802.3 standard registers are defined, or any register between 32,768 and 65,535 if a vendor-specific register is to be used.

Furthermore, embodiments of this specification need not use a new register, but rather may "piggyback" on existing registers. Many existing registers have two or more contiguous reserved bits that can be used to control an impedance state, particularly if a small, discrete number of presets are used.

For example, registers may be allocated to separately control the termination of the receiver and transmitter in a PMD. A possible specification is a selection of four values on single-ended terminations, for example, from 40 ohms to 55 ohms in 5-ohm steps. This would require allocation of two bits for receiver control and two bits for transmitter control. In a multi-lane PMD, the controls may be separated for each lane or common for all lanes. Furthermore, bits may be allocated to enable communication with a management entity, which may include the value of the link partner's transmitter termination, as well as requests to change it.

This specification also provides a protocol by which a receiver can request to change the termination of the link partner's transmitter. The protocol may be based on existing link training protocols such as that specified in P802.3cd. This protocol exchanges training frames that include control (write) and status (read) fields between the two partners. The control field and the status field structures for the existing link training registers are illustrated in the two tables below. These tables have been modified, by way of nonlimiting illustration, to provide impedance control.

TABLE 1 below illustrates an example IEEE P802.3 transmitter impedance register that may be defined. The bit allocations listed here are provided by way of nonlimiting example only. Note that additional bit fields, such as a lane identifier field for a multi-lane link, may also be included.

TABLE 1

| Bit(s) Name | Description |
| --- | --- |
| 15 Request Flag | 1 = Tx Impedance Change Request<br>0 = No Tx Impedance Change Request |
| 14:12 Reserved | Transmit as 0, ignore on receipt |
| 11:10 Impedance Request | 9 8 |

TABLE 1-continued

| Bit(s) | Name | Description |
|---|---|---|
| | | 1 1 = Preset 4 |
| | | 1 0 = Preset 3 |
| | | 0 1 = Preset 2 |
| | | 0 0 = Preset 1 |
| 9:7 | Reserved | Transmit as 0, ignore on receipt |
| 6:5 | Remote Impedance Setting | 6 5 |
| | | 1 1 = Preset 4 |
| | | 1 0 = Preset 3 |
| | | 0 1 = Preset 2 |
| | | 0 0 = Preset 1 |
| 4:2 | Reserved | Transmit as 0, ignore on receipt |
| 1:0 | Local Impedance Setting | 1 0 |
| | | 1 1 = Preset 4 |
| | | 1 0 = Preset 3 |
| | | 0 1 = Preset 2 |
| | | 0 0 = Preset 1 |

The bit fields in TABLE 1 may also be defined as "piggybacked" on one or more existing IEEE P802.3 registers using bits that are currently reserved. Possible existing registers include, as nonlimiting examples, register 1.152 (BASE-R LP coefficient update, lane 0) which has eight reserved bits, register 1.153 (BASE-R LP report, lane0) which has nine reserved bits, and similar registers 1.154, 1.155, 1.1101 through 1.1109, 1.1201 through 1.1209, 1.1301 through 1.1309, and 1.1401 through 1.1409.

TABLE 2 below illustrates an example message structure that is exchanged between link partners. The status field in the link start-up protocol is defined in IEEE P802.3cd clause 136.8.11.33.

TABLE 2

(Status Field Structure)

| Bit(s) | Name | Description |
|---|---|---|
| 15 | Receiver ready | 1 = Training is complete and the receiver is ready for data |
| | | 0 = Request for training to continue |
| 14:12 | Reserved | Transmit as 0, ignore on receipt |
| 11:10 | Modulation and precoding status | 11 10 |
| | | 1 1 = PAM4 |
| | | 1 0 = PAM4 |
| | | 0 1 = Reserved |
| | | 0 0 = PAM2 |
| 9 | Receiver frame lock | 1 = Frame boundaries identified |
| | | 0 = Frame boundaries not identified |
| 8 | Initial condition status | 1 = Updated |
| | | 0 = Not updated |
| 7 | Parity | Even parity bit |
| 6 | Reserved | Transmit as 0, ignore on receipt |
| 5:3 | Coefficient select echo | 5 4 3 |
| | | 1 1 0 = c(−2) |
| | | 1 1 1 = c(−1) |
| | | 0 0 0 = c(0) |
| | | 0 0 1 = c(1) |
| 2:0 | Coefficient status | 2 1 0 |
| | | 1 1 1 = Reserved |
| | | 1 1 0 = Coefficient at limit/equalization limit |
| | | 1 0 1 = Reserved |
| | | 1 0 0 = Equalization limit |
| | | 0 1 1 = Coefficient not supported |
| | | 0 1 0 = Coefficient at limit |
| | | 0 0 1 = Updated |
| | | 0 0 0 = Not updated |

"Termination request" and "termination status" bit fields may be added to the above message using the reserved bits. As noted above, while certain specific examples are provided by way of illustration, any combination of the reserved bits may be used, so long as the proper number of bits is selected to carry the desired amount of information.

The behavior and the protocol for changing the impedance may be similar to the behavior of the "initial condition request" and "initial condition status" fields, as specified in subclause 136.8.11.4.1 of P802.3cd. Namely, a partner that receives a request in the "termination request" field to set a new termination value may acknowledge the completion of the setting to the requested termination by setting the termination status field to "updated." The request may be completed by setting the "termination request" bit field to a specific value (e.g., 0) that means "no change." A corresponding setting of the "termination status" field may be set to "not updated."

Because one of the bit combinations is reserved for "no change," the protocol as illustrated here can support requests of three termination values with a 2-bit field, or seven values with a 3-bit field. Bits 7 through 5 in the control field are currently reserved, and can be used for the termination request. Bit 6 in the status field is currently reserved and could be used for the termination status.

Note that the positions of these bits are provided by way of illustrative and nonlimiting example, only. In a general case, a 2-bit receive impedance selection field could be provided in this existing register in any of bits 5 through 6, 6 through 7, 10 through 11, or 14 through 15. Furthermore, a transmit impedance selection field could be provided in any of bits 5 through 6, 6 through 7, 10 through 11, or 14 through 15. Furthermore, if a field other than a 2-bit field is used (such as a 1-bit or a 3-bit field), other bit combinations could be used. For a 1-bit field, any of bits 5, 6, 7, 10, 11, 14, or 15 could be used for either a transmit or receive selection. If a 3-bit field is utilized, then bits 5 through 7 may be used for the transmit or receive selection. If it is desirable to nevertheless use the register for both transmit and receive, and a 3-bit field is required, then one of the fields could be in bits 5 through 7, while another field could span bits such as 10 through 11 and one of 14 or 15, or 14 and 15 and one of 10 through 11. In a general case, any of the reserved bits may be used in any suitable combination to control the impedance of the transmit or receive PHY.

Alternatively, the requests could be stated as increment/decrement requests relative to the current value, similar to the "coefficient request" field. This would require a minimum and maximum step-size specification, and a response that can signal "minimum" or "maximum," in addition to "updated."

Embodiments of the training protocol use relatively low-speed signaling and messages that are easily observable, for example, by way of using an oscilloscope. The effects of the protocol can also be observed through standardized registers, which can be used to control the transmitter (e.g., for termination) externally.

In some embodiments, the PHY (e.g., PMA 320 and/or variable impedance terminals 304) may be sold or provided separately from the other elements of network controller 300, and then be integrated by a vendor.

Figure 4:
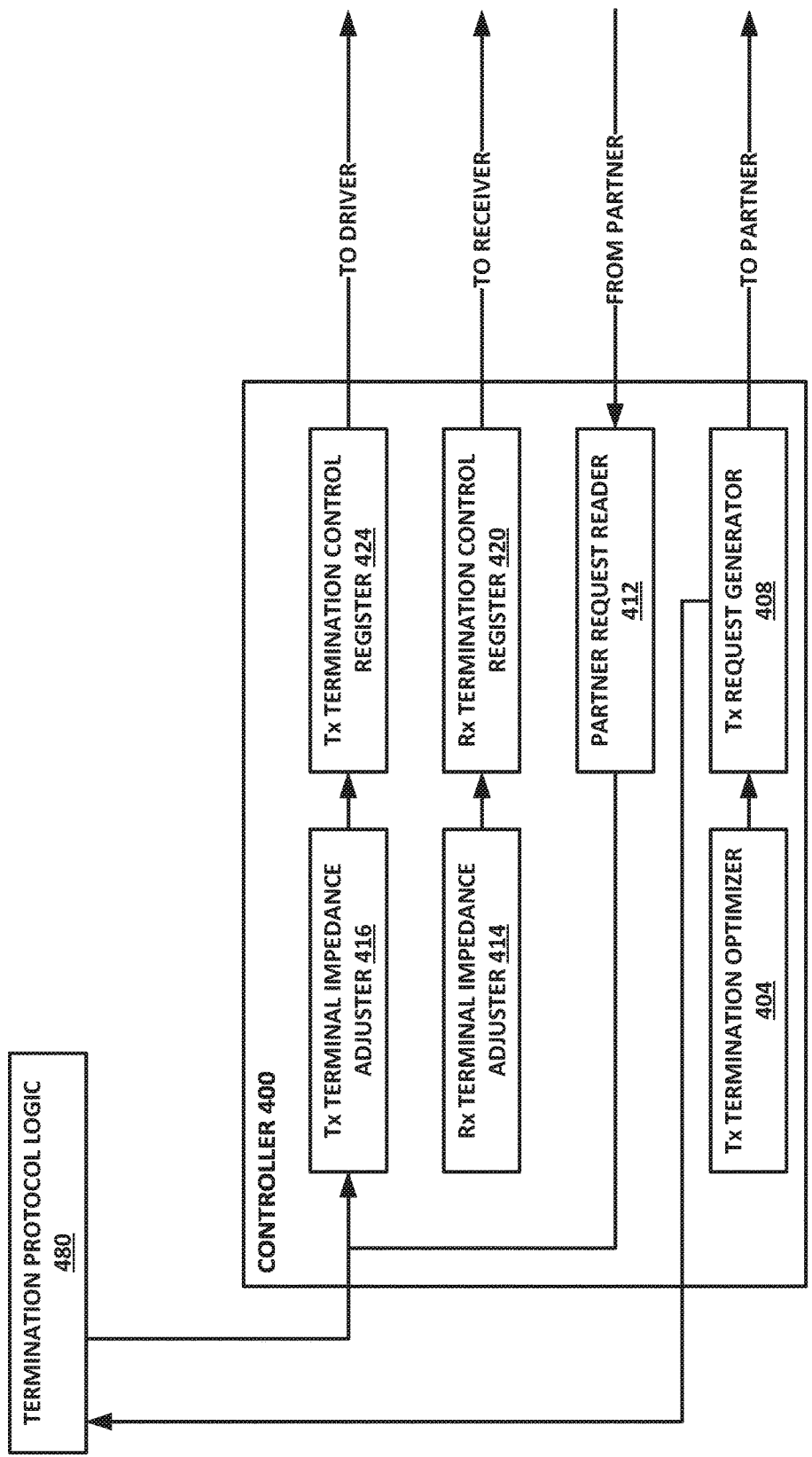
FIG. 4 is a block diagram of an embodiment of a controller, according to the teachings of the present specification.

FIG. 4 is a block diagram of an embodiment of a controller 400, according to the teachings of the present specification. Controller 400 may be, for example, an embodiment of controller 308 of FIG. 3. In other cases, controller 400 could be a different controller.

Controller 400 interfaces with termination protocol logic 480, which may be in some cases an embodiment of termination protocol logic 380 of FIG. 3. Termination protocol logic 480 enables PCS and higher sublayers 328 of FIG. 3 to interface with controller 308 or controller 400 of FIG. 4.

By way of illustrative example, controller 400 provides data to the link partner via the transmit request generator 408, and receives data from the link partner via partner request reader 412. Controller 400 also interfaces with the PMA, such as PMA 320, including variable or configurable impedance elements within the send and receive terminals. Transmission termination control register 424 may be used to drive and configure a driver, while receive termination control registers 420 may be used to drive and control a receiver. Note that either the driver or the receiver may have a configurable impedance, or both may have a configurable impedance.

Controller 400 includes a transmit terminal impedance adjuster 416, which may include logic and/or circuitry to control the state of transmit termination control register 424. Specifically, transmit terminal impedance adjuster 416 may have logic to write values to or read values from transmit termination control register 424. Transmit termination control register 424 may be any of the registers discussed in connection with control registers 310, or any other suitable register.

Receive terminal impedance adjuster 414 may be used to read from or write to values in receive termination control register 420. Receive termination control register 420 may also include any of the registers discussed in connection with control registers 310 of FIG. 3.

Controller 400 also includes a partner request reader 412. Partner request reader 412 can receive requests to change terminal impedance either directly from the link partner or from a management entity. The transmit terminal impedance adjuster 416 can then be used to carry out the required adjustment.

Similarly, controller 400 includes a transmit termination optimizer 404, which computes a desired or optimal impedance for the link partner. Transmit request generator 408 can then generate a request and send it to the link partner, as well as informing termination protocol logic 480 of the requested change. This can allow controller 400 to either request a specific terminal impedance, for example if it is designed to a known desired terminal impedance, or it can perform a method such as an impedance sweep to empirically find an optimal partner impedance.

FIG. 5 is a block diagram of a driver subsystem 500, according to the teachings of the present specification. Driver subsystem 500 may in some cases be an embodiment of driver subsystem 312 of FIG. 3, or may be a different driver subsystem 500.

In this example, driver subsystem 500 receives as inputs a transmit clock and a serialized bitstream. These are provided to a differential voltage driver 504, which interfaces with a PMA having first and second adjustable or configurable impedances R1 and R2.

Differential voltage driver 504 drives a differential signal onto the differential transmit channel. The differential signal may nominally be 50 ohms single-ended (e.g., R1 and R2 both have a nominal value of 50 ohms), which may be, for example, the nominal impedance specified by the Ethernet standard.

This can be verified by return loss measurements that are specified for each PMD. The return loss may be measured in the frequency domain using, for example, a vector network analyzer (VNA). For example, IEEE standard P802.3-2015 clause 93 specifies a differential return loss (referenced to 100-ohm impedance) for a physical medium dependent (PMD) transmitter for communication over backplanes.

Note that while this illustration shows a differential transmit channel, and uses the 100-ohm nominal impedance of the Ethernet standard, this is not intended to preclude other embodiments. Rather, any suitable driver subsystem with any suitable nominal impedance may be used.

Configurable impedances R1 and R2 may be configured, for example, by termination control registers 424 and 420 of FIG. 4, or by other control elements. Note, however, that while a particular embodiment of a controller 400 is illustrated, other types of controllers may be used.

FIG. 6 is a block diagram of receiver subsystem 600, according to the teachings of the present specification. As illustrated in FIG. 6, receiver subsystem 600 may be an embodiment of receiver subsystem 316 of FIG. 3, or may be a different receiver subsystem. While receiver subsystem 600 illustrates one potential embodiment of a receiver subsystem 316 of FIG. 3, it should be noted that other types of receiver subsystems could be used, and this embodiment is provided only to illustrate a potential practice of the teachings.

Receiver subsystem 600 includes a clock/data recovery block 604, which receives incoming data from a link partner via a differential Tx channel. The differential Tx channel is loaded by two parallel resistors R1 and R2, both with reference to ground, and providing differential inputs to the differential input nodes of clock/data recovery block 604. It is noted again that this configuration is a nonlimiting example only, and other configurations are possible.

As illustrated here, resistors R1 and R2 may be configurable or variable resistors, and may have their values controlled, for example, by receive termination control registers 420 of FIG. 4, or some other control apparatus of a controller such as controller 400 of FIG. 4, or a different controller.

Clock/data recovery block 604 recovers the receive clock from the differential channel, and reconstructs a serialized bitstream, which can then be output to, for example, PCS and higher sublayers 328 of network controller 300.

Figure 7:
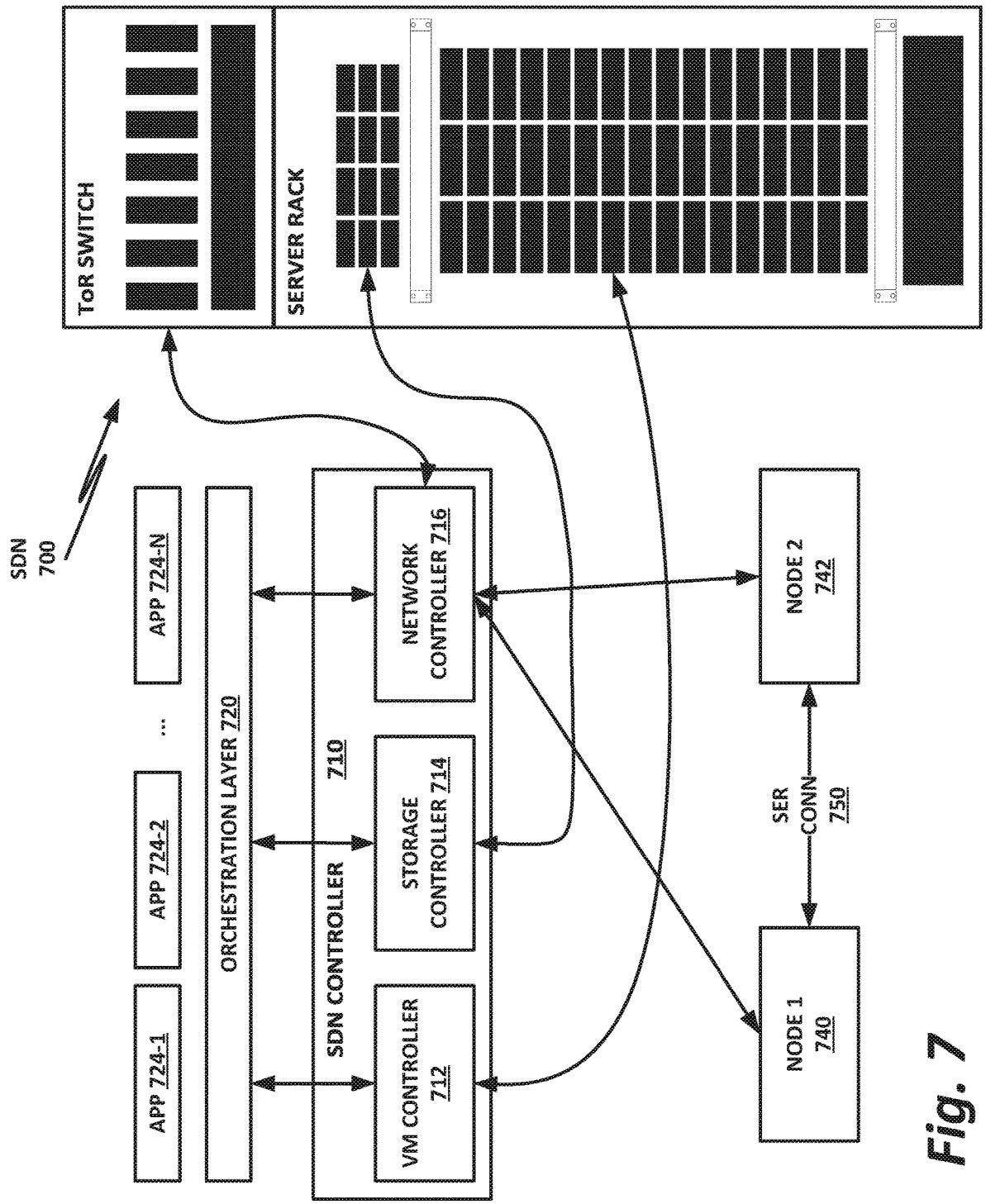
FIG. 7 is a block diagram of a software-defined network, according to the teachings of the present specification.

FIG. 7 is a block diagram of a software-defined network (SDN) 700. Embodiments of SDN 700 disclosed herein may be adapted or configured to provide a variable impedance communication terminal, according to the teachings of the present specification.

In SDN, a single configuration utility (often a graphical interface or browser interface) may be used to manage network resources at a high level, with very little manual human intervention into the details of the network. SDN may provide a data plane that is separate from a control plane, to separate management functions from data functions. Another benefit of SDNs is that they may be based on open standards, thus providing portability between systems, and alleviating issues of vendor lock-in.

SDN 700 is controlled by an SDN controller 710, which may include, for example, a VM controller 712, a storage controller 714, and a network controller 716. Other SDN controller functions may also be provided in other embodiments, and not every embodiment is required to have the foregoing elements. SDN controller 710 provides an orchestration layer 720. The orchestration layer may employ an open orchestration protocol, such as the OpenStack cloud operating system.

Orchestration layer 720 may include various plug-in components that can be used as interfaces to control data center resources. These plugins may interact with orchestration layer 720 via a set of standardized and open APIs, thus enabling different vendors to provide different plugins.

In many cases, data center resources can all be managed via a single graphical interface provided by orchestration layer 720. For example, OpenStack currently provides a dashboard called "Horizon," which provides a monolithic interface that enables an administrator to fully configure and administer a data center.

In some embodiments, orchestration layer 720 provides a northbound API, on which may be instantiated various applications or functions, such as applications 724-1-724-N illustrated here. Each application 724 may be provided on a discrete virtual network device or container (referred to herein generically as "network devices"). Applications 724 may be configured to perform a variety of network functions, such as, by way of nonlimiting example, load balancing, firewall, deep packet inspection (DPI), DNS, antivirus, or any other suitable network function. The particular arrangement of interconnections between network devices 730 and from network devices 730 to host devices 740 may be determined by the particular network configuration and needs. Thus, the specific configuration of FIG. 7 should be understood to be an illustrative example only.

Orchestration layer 720 may provide communication protocols, including in some embodiments OpenFlow. OpenFlow centralizes networking intelligence into an SDN controller such as SDN controller 710. Using OpenFlow, switches and routers do not need to use prior data exchange protocols to learn about the network topology and other environmental factors. These topology data are replicated across all switches and routers in the network, and each one maintains forwarding tables. In contrast, an OpenFlow controller (which may be, for example, a function of network controller 716) provides centralized network management that maintains the network state in a central repository. Network controller 716 can then update forwarding tables as the network topology evolves or changes, generate a forwarding table for each switch or router, and push them out to network devices as necessary. This realizes separation of the control plane and the data plane. Individual network devices may implement the OpenFlow API by adding an OpenFlow shim layer that translates OpenFlow API function calls into native function calls for the switch or router.

Node 1 740 may communicatively couple with node 2 742 via a serial connection 750. This may be, for example, an Ethernet connection or any other suitable serial or parallel connection, according to the teachings of the present specification. A serial connector 750 is used herein to illustrate a useful embodiment of the teachings herein.

Node 1 740 and node 2 742 may also both communicatively couple to network controller 716. Network controller 716 may be an SDN controller, a hypervisor, a VMM, a cloud data center manager, or any other suitable management entity.

Illustrated in connection with FIG. 3 are certain registers that may be used to directly control the impedances of the terminals illustrated herein. It is also possible to control impedances via a request/response framework. A register useful in such a request/response framework is illustrated in TABLE 3.

TABLE 3

Indirect Impedance Control Register

| Bit(s) | Name | Description | R/W |
|---|---|---|---|
| 15 | Request Flag | 1 = Tx Impedance Change Request | RO |

TABLE 3-continued

Indirect Impedance Control Register

| Bit(s) | Name | Description | R/W |
|---|---|---|---|
| | | 0 = No Tx Impedance Change Request | |
| 14:12 | Reserved | Transmit as 0, ignore on receipt | R/W |
| 11:10 | Impedance Request | 9 8 | RO |
| | | 1 1 = Preset 4 | |
| | | 1 0 = Preset 3 | |
| | | 0 1 = Preset 2 | |
| | | 0 0 = Preset 1 | |
| 9:7 | Reserved | Transmit as 0, ignore on receipt | R/W |
| 6:5 | Remote Impedance Setting | 6 5 | R/W |
| | | 1 1 = Preset 4 | |
| | | 1 0 = Preset 3 | |
| | | 0 1 = Preset 2 | |
| | | 0 0 = Preset 1 | |
| 4:2 | Reserved | Transmit as 0, ignore on receipt | R/W |
| 1:0 | Local Impedance Setting | 1 0 | R/W |
| | | 1 1 = Preset 4 | |
| | | 1 0 = Preset 3 | |
| | | 0 1 = Preset 2 | |
| | | 0 0 = Preset 1 | |

In this register, fields are provided for a local impedance setting, a remote impedance setting, an impedance request, and a request flag.

The local impedance setting field is illustrated in this embodiment as bits 0 and 1. However, in a general case, the local impedance setting may inhabit any bits from 0 to 15 of the 16-bit register illustrated, and may be of any suitable size to provide the granularity of impedance control desired in the embodiment.

The local impedance setting field includes an indication of the current local impedance that is assigned to the terminal. In this case, four presets are provided, and a 2-bit field is used. This field is read-write with respect to an external entity, such as the link partner (e.g., node 2 742) or more commonly a management entity such as network controller 716. In a preset settings exchange method, the local setting may both be read by a management entity (value to be then written to the partner as "remote impedance setting"), and written by the management entity (to apply a request from the partner for a new setting).

Note that in a relative step request method (e.g., in an impedance sweep), the local impedance register does not need to be specified by a standard, since the requests are always relative. An implementation of this method may have a register to control the local impedance setting, and it will be R/W.

Also illustrated in the register are bits 5 and 6, providing a remote impedance setting. The remote impedance setting is a read/write field, and can be directly programmed by, for example, network controller 716 or node 2 742. The remote impedance setting is written to inform the local node (e.g. node 740) of the impedance of the remote node (e.g. node 2 742) so that the local node can decide to request a specific higher or lower impedance. If the request method is relative (e.g., increment/decrement) instead, then there is no need for the remote impedance field.

Again illustrated here are four presets, with a 2-bit field used to request one of the preset values. It should be noted, however, that other embodiments are possible. For example, the remote impedance setting could be used to increment or decrement the impedance, rather than to directly request a setting for an impedance.

In cases where a management entity such as network controller 716 provides the link remediation, the impedance request field and the request flag may be used to push a request out to network controller 716. In this case, setting the request flag at bit 15 to 1 indicates that a transmit impedance change request is pending. When the bit is set to 0, it indicates that no transmit impedance change request is pending. When network controller 716 sees that the request flag is set, it reads the requested impedance from the impedance request field (in this example, bits 11:10) and sends a signal to node 2 742 indicating that node 1 740 has requested a new impedance value. This "signal" may include writing to the local impedance value of node 2 742. Once node 1 740 verifies that node 2 742 has assumed the requested impedance, which may be based on the writing of a new "remote impedance" value of node 1 740, it may clear the request flag at bit 15, thus indicating that no impedance adjustment is required.

The present specification also includes a method to test the impedance of a link as described herein. For example, in the case of Ethernet, the specified reference impedance is 100 ohms differential or 50 ohms single-ended. This can be verified by return loss measurements specified for each PMD. The return loss may be measured in the frequency domain using a VNA or similar device.

IEEE standard P802.3-2015 specifies in clause 93 a differential return loss (referenced to 100-ohm impedance) for a PMD transmitter for communication over backplanes. The differential return loss of the transmitter, in decibels, is required to meet the following equation:

$$RL_d(f) \geq \begin{Bmatrix} 12.5 - f & 0.05 \leq f \leq 6 \\ 6.5 - 0.075f & 6 < f \leq 19 \end{Bmatrix} dB$$

The return loss of 12 dB (or in other words, a gain of −12 dB, or a factor of plus or minus ¼) at DC limits the termination according to the equation:

$$\Gamma_1 = \Gamma_2 = \frac{R_d - R_0}{R_d + R_0}$$

Because $R_0$ is 50 ohms (single-ended value for 100-ohm differential), the minimum and maximum allowed values for single-ended termination $R_d$ are 30 ohms and 83.33 ohms, respectively. In practice, in order to meet the stricter specification at frequencies higher than DC, the actual range is smaller.

There are, however, limitations to this method of computation, and it may be replaced by other methods. For example, the impedance may be measured by integration of the return loss over frequencies.

Existing test methods may be modified to re-normalize the measured results from the original test equipment impedance (for example, 50 ohms single-ended) to the desired impedance. This feature is available in many pieces of existing test equipment. For example, if a transmitter is configured to an impedance of 40 ohms, the measurement result may be normalized from 50 ohms to 40 ohms, and if the impedance is correct, the return loss will have a high loss value.

However, the return loss masks require a higher loss at DC after renormalization than the existing loss masks. This is to verify that the termination is close to the selected value without allowing large tolerance.

Alternatively, the DC resistance of the transmitter and a receiver may be measured using an ohmmeter or similar device.

Note that while this illustration shows a single SDN controller 710, in large data centers, an orchestration controller may control a number of distributed SDN controllers. In some embodiments, SDN controllers and orchestrators can communicate with one another to remain synchronization and state information via a sideband, such as a separate, lower-speed Ethernet connection.

Figure 8:
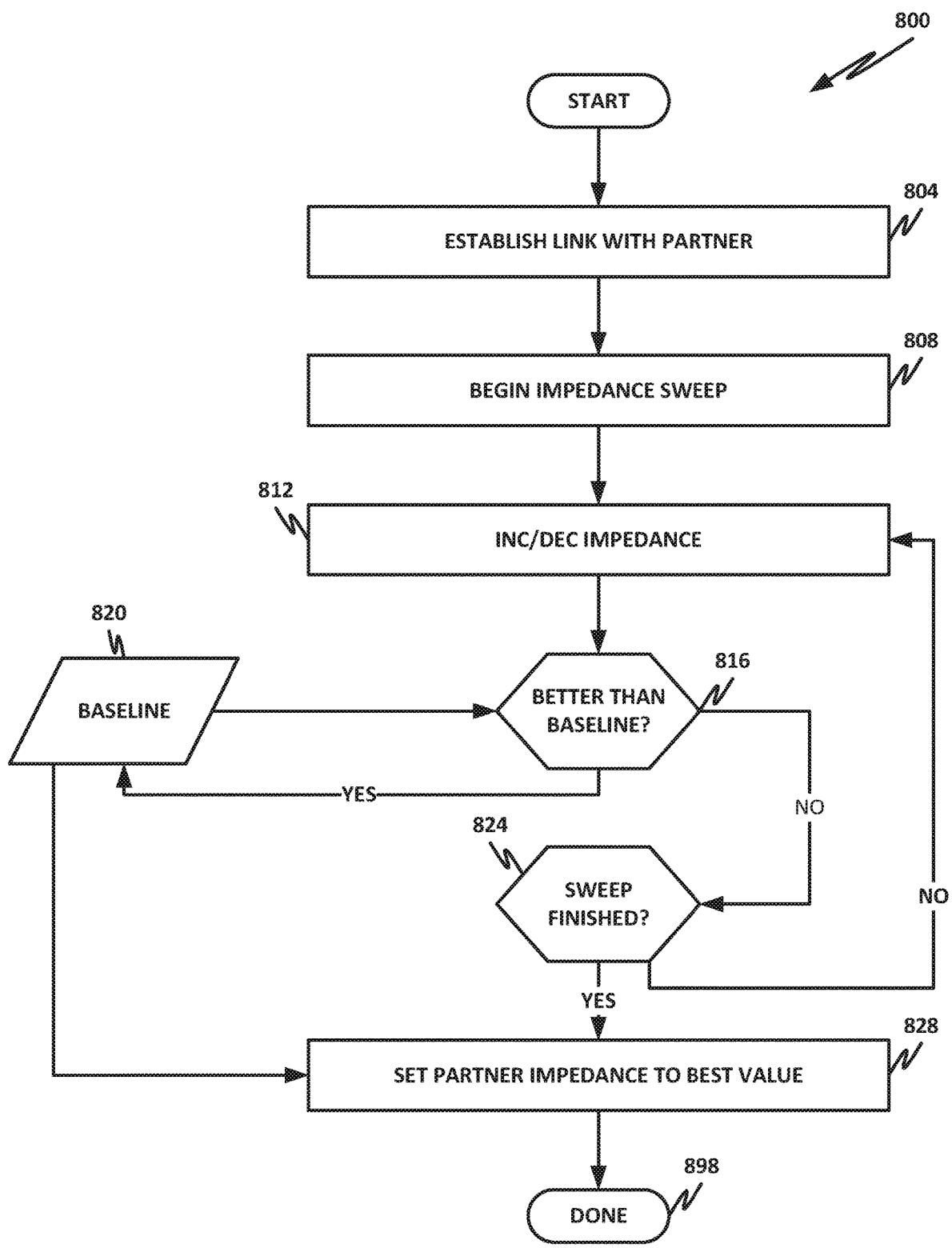
FIG. 8 is a flowchart of a method of selecting an impedance, according to the teachings of the present specification.

FIG. 8 is a flowchart of a method of selecting an impedance, according to the teachings of the present specification. Note that when a small number of combinations of transmitter and receiver terminations are provided, the number of combinations and permutations is finite and also relatively small. For example, throughout the specification, examples have been illustrated in which four presets are used for possible impedance values. In the case of four presets, with four options on each end, there are a total of 16 different combinations of transmit and receive impedances. This enables an algorithm to relatively easily "brute force" search for an optimal impedance based on some figure of merit, such as the signal-to-noise ratio (SNR) or eye height. These figures of merit are commonly measured and reported by existing receivers, and they are often correlated with a bit error ratio (BER). Thus, an effective algorithm may seek to minimize the BER over a search space.

A characteristic of a brute force minimizing algorithm is that any combination of termination impedances will yield a BER or figure of merit that can be compared to a previously-established baseline value. Thus, when the range of possible impedance combinations is swept, the first combination may be recorded as a baseline. As the sweep continues, a new combination gets recorded as the new baseline only if it performs better than the current baseline. Once the sweep is completed, the combination associated with the last-recorded baseline value is selected as the best combination, and the links are set to that combination.

This is illustrated in method 800, where impedance values are swept over a number of combinations, by way of serial, parallel, or other communication medium.

Starting at block 804, an endpoint device, network controller, or some other entity establishes a link with its link partner.

In block 808, the device begins an impedance sweep. Note that this impedance sweep can be initiated by the device itself, by the partner device, or by a management entity such as an SDN controller.

In block 812, the device increments or decrements either its own impedance or the partner impedance, depending on the current combination. The combination of incrementing and decrementing may be selected so as to sweep the full range of available impedance combinations over the course of the algorithm. This brute force method is practical, and may be particularly desirable, in cases where there is a relatively small number of discrete impedance values, so that the combination space is relatively limited. Again, note that the increment and decrement could be initiated by the device itself, by the link partner, or by a management entity such as an SDN controller. If this is the first point in the sweep, then the performance at this point (along with the selected values) should be recorded as the initial value for baseline 820.

In decision block 816, the system checks to determine whether the observed performance for this point is better than currently established baseline value 820. For example, the system may observe the measured BER or a figure of merit, and compare that to the best existing BER or figure of merit.

If the current value is better than baseline 820, then the current value is written as a new baseline 820. Once new baseline 820 has been written, then in block 824, the system checks to see whether the sweep is finished.

Returning to decision block 816, if the current observed value is not better than the previously observed baseline, then in block 824, a check is made to see whether the sweep is finished.

In block 824, if the sweep is not finished, control passes back to block 812, where the impedance value is incremented or decremented again, and the method continues.

Returning to decision block 824, if the sweep is finished, then in block 828, the link impedance is set to the combination that yielded the best observed performance as read from the baseline value 820. Note that baseline value 820 may include a record not only of the observed performance, but also of the combination of values that yielded that performance.

Figure 9:
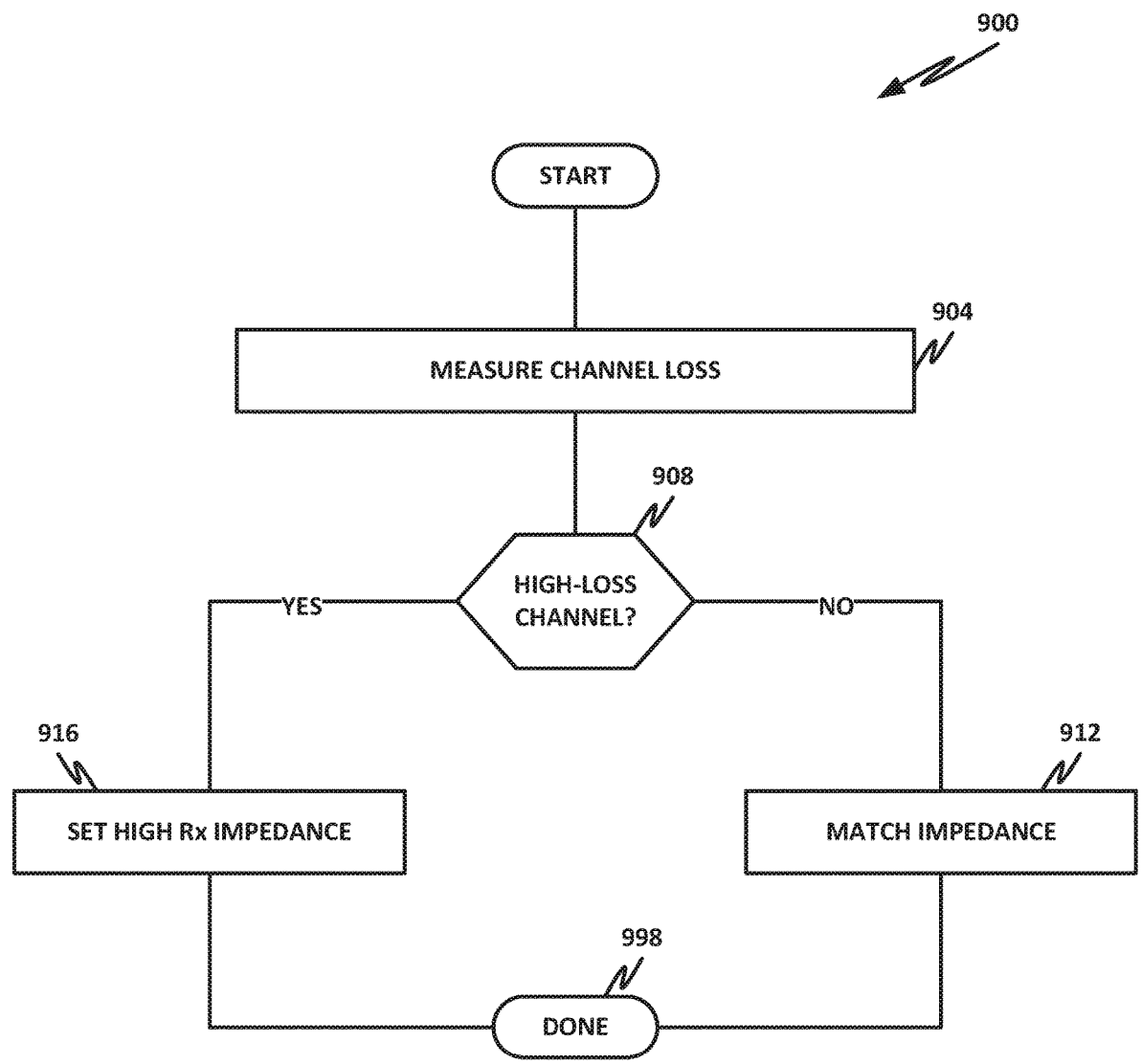
FIG. 9 is a flowchart of a method of configuring impedance according to the teachings of the present specification.

FIG. 9 is a flowchart of a method 900 of configuring impedance according to the teachings of the present specification. The approach illustrated in method 900 relies on the fact that for a low-loss channel, minimizing reflections (and especially re-reflections, which appear at the receiver end as echoes) is more important than maximizing the voltage at the receiver's termination. On the other hand, for high-loss channels, reflections are attenuated by the channel. This means that reflections in high-loss systems are less important than the actual signal level.

Method 900 provides an algorithm that may choose the termination combinations in a single step after identifying or measuring the channel loss. For a low-loss channel, the terminations may be set to be equal, and matched to the interconnect impedance, such as the nominal impedance.

With high-loss channels, a higher termination resistance may be set on the receiver, with a lower termination resistance on the transmitter.

Starting at block 904 of method 900, the system initially measures, observes, or otherwise determines the channel loss.

In decision block 908, the system determines whether this is a high-loss channel.

If the system is determined to have a high-loss channel, then in block 916, the system sets a relatively high receive impedance, and a relatively low transmit impedance. In some embodiments, the delta between the transmit impedance and the receive impedance may be selected to maximize the difference. For example, the transmit impedance may be set at its lowest available preset value, while the receive impedance may be set at its highest available preset value.

Returning to block 908, if this is not a high-loss channel, then in block 912, the impedances are matched for the two link partners. For example, both link partners may be set to the nominal impedance of the specification.

In block 998, the method is done.

Figure 10:
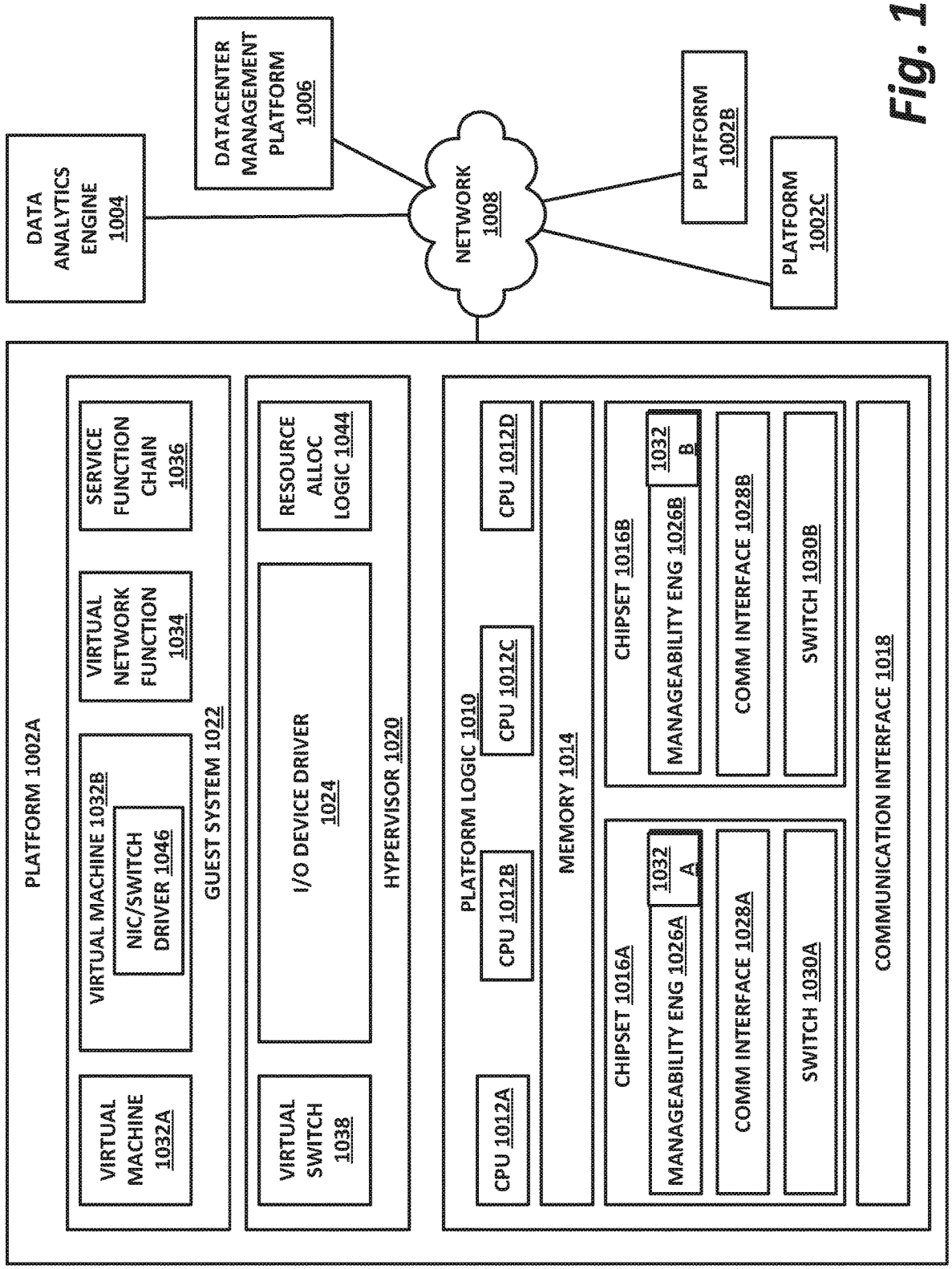
FIG. 10 is a block diagram of components of a computing platform, according to the teachings of the present specification.

FIG. 10 is a block diagram of components of a computing platform 1002A. Embodiments of computing platform 1002A disclosed herein may be adapted or configured to provide a variable impedance communication terminal, according to the teachings of the present specification.

In the embodiment depicted, hardware platforms 1002A, 1002B, and 1002C, along with a data center management platform 1006 and data analytics engine 1004 are interconnected via network 1008. In other embodiments, a computer system may include any suitable number of (i.e., one or more) platforms, including hardware, software, firmware, and other components. In some embodiments (e.g., when a computer system only includes a single platform), all or a portion of the system management platform 1006 may be included on a platform 1002. A platform 1002 may include platform logic 1010 with one or more central processing units (CPUs) 1012, memories 1014 (which may include any number of different modules), chipsets 1016, communication interfaces 1018, and any other suitable hardware and/or software to execute a hypervisor 1020 or other operating system capable of executing workloads associated with applications running on platform 1002. In some embodiments, a platform 1002 may function as a host platform for one or more guest systems 1022 that invoke these applications. Platform 1002A may represent any suitable computing environment, such as a high-performance computing environment, a data center, a communications service provider infrastructure (e.g., one or more portions of an Evolved Packet Core), an in-memory computing environment, a computing system of a vehicle (e.g., an automobile or airplane), an Internet of Things environment, an industrial control system, other computing environment, or combination thereof.

In various embodiments of the present disclosure, accumulated stress and/or rates of stress accumulated of a plurality of hardware resources (e.g., cores and uncores) are monitored and entities (e.g., system management platform 1006, hypervisor 1020, or other operating system) of computer platform 1002A may assign hardware resources of platform logic 1010 to perform workloads in accordance with the stress information. In some embodiments, self-diagnostic capabilities may be combined with the stress monitoring to more accurately determine the health of the hardware resources. Each platform 1002 may include platform logic 1010. Platform logic 1010 comprises, among other logic enabling the functionality of platform 1002, one or more CPUs 1012, memory 1014, one or more chipsets 1016, and communication interfaces 1028. Although three platforms are illustrated, computer platform 1002A may be interconnected with any suitable number of platforms. In various embodiments, a platform 1002 may reside on a circuit board that is installed in a chassis, rack, or other suitable structure that comprises multiple platforms coupled together through network 1008 (which may comprise, e.g., a rack or backplane switch).

CPUs 1012 may each comprise any suitable number of processor cores and supporting logic (e.g., uncores). The cores may be coupled to each other, to memory 1014, to at least one chipset 1016, and/or to a communication interface 1018, through one or more controllers residing on CPU 1012 and/or chipset 1016. In particular embodiments, a CPU 1012 is embodied within a socket that is permanently or removably coupled to platform 1002A. Although four CPUs are shown, a platform 1002 may include any suitable number of CPUs.

Memory 1014 may comprise any form of volatile or non-volatile memory including, without limitation, magnetic media (e.g., one or more tape drives), optical media, random access memory (RAM), ROM, flash memory, removable media, or any other suitable local or remote memory component or components. Memory 1014 may be used for short, medium, and/or long-term storage by platform 1002A. Memory 1014 may store any suitable data or information utilized by platform logic 1010, including software embedded in a computer-readable medium, and/or encoded logic incorporated in hardware or otherwise stored (e.g., firmware). Memory 1014 may store data that is used by cores of CPUs 1012. In some embodiments, memory 1014 may also comprise storage for instructions that may be executed by the cores of CPUs 1012 or other processing elements (e.g., logic resident on chipsets 1016) to provide functionality associated with the manageability engine 1026 or other components of platform logic 1010. A platform 1002 may also include one or more chipsets 1016 comprising any suitable logic to support the operation of the CPUs 1012. In various embodiments, chipset 1016 may reside on the same die or package as a CPU 1012 or on one or more different dies or packages. Each chipset may support any suitable number of CPUs 1012. A chipset 1016 may also include one or more controllers to couple other components of platform logic 1010 (e.g., communication interface 1018 or memory 1014) to one or more CPUs. In the embodiment depicted, each chipset 1016 also includes a manageability engine 1026. Manageability engine 1026 may include any suitable logic to support the operation of chipset 1016. In a particular embodiment, a manageability engine 1026 (which may also be referred to as an innovation engine) is capable of collecting real-time telemetry data from the chipset 1016, the CPU(s) 1012 and/or memory 1014 managed by the chipset 1016, other components of platform logic 1010, and/or various connections between components of platform logic 1010. In various embodiments, the telemetry data collected includes the stress information described herein.

In various embodiments, a manageability engine 1026 operates as an out-of-band asynchronous compute agent which is capable of interfacing with the various elements of platform logic 1010 to collect telemetry data with no or minimal disruption to running processes on CPUs 1012. For example, manageability engine 1026 may comprise a dedicated processing element (e.g., a processor, controller, or other logic) on chipset 1016, which provides the functionality of manageability engine 1026 (e.g., by executing software instructions), thus conserving processing cycles of CPUs 1012 for operations associated with the workloads performed by the platform logic 1010. Moreover, the dedicated logic for the manageability engine 1026 may operate asynchronously with respect to the CPUs 1012 and may gather at least some of the telemetry data without increasing the load on the CPUs.

A manageability engine 1026 may process telemetry data it collects (specific examples of the processing of stress information are provided herein). In various embodiments, manageability engine 1026 reports the data it collects and/or the results of its processing to other elements in the computer system, such as one or more hypervisors 1020 or other operating systems and/or system management software (which may run on any suitable logic such as system management platform 1006). In particular embodiments, a critical event such as a core that has accumulated an excessive amount of stress may be reported prior to the normal interval for reporting telemetry data (e.g., a notification may be sent immediately upon detection).

Additionally, manageability engine 1026 may include programmable code configurable to set which CPU(s) 1012 a particular chipset 1016 manages and/or which telemetry data may be collected.

Chipsets 1016 also each include a communication interface 1028. Communication interface 1028 may be used for the communication of signaling and/or data between chipset 1016 and one or more I/O devices, one or more networks 1008, and/or one or more devices coupled to network 1008 (e.g., system management platform 1006). For example, communication interface 1028 may be used to send and receive network traffic such as data packets. In a particular embodiment, a communication interface 1028 comprises one or more physical network interface controllers (NICs), also known as network interface cards or network adapters. A NIC may include electronic circuitry to communicate using any suitable physical layer and data link layer standard such as Ethernet (e.g., as defined by a IEEE P802.3 standard, which in some cases may be modified according to the teachings of this specification), Fibre Channel, InfiniBand, Wi-Fi, or other suitable standard. A NIC may include one or more physical ports that may couple to a cable (e.g., an Ethernet cable). A NIC may enable communication between any suitable element of chipset 1016 (e.g., manageability engine 1026 or switch 1030) and another device coupled to network 1008. In various embodiments a NIC may be integrated with the chipset (i.e., may be on the same integrated circuit or circuit board as the rest of the chipset logic) or may be on a different integrated circuit or circuit board that is electromechanically coupled to the chipset.

In particular embodiments, communication interfaces 1028 may allow communication of data (e.g., between the manageability engine 1026 and the data center management platform 1006) associated with management and monitoring functions performed by manageability engine 1026. In various embodiments, manageability engine 1026 may utilize elements (e.g., one or more NICs) of communication interfaces 1028 to report the telemetry data (e.g., to system management platform 1006) in order to reserve usage of NICs of communication interface 1018 for operations associated with workloads performed by platform logic 1010.

Switches 1030 may couple to various ports (e.g., provided by NICs) of communication interface 1028 and may switch data between these ports and various components of chipset 1016 (e.g., one or more peripheral component interconnect express (PCIe) lanes coupled to CPUs 1012). Switches 1030 may be a physical or virtual (i.e., software) switch.

Platform logic 1010 may include an additional communication interface 1018. Similar to communication interfaces 1028, communication interfaces 1018 may be used for the communication of signaling and/or data between platform logic 1010 and one or more networks 1008 and one or more devices coupled to the network 1008. For example, communication interface 1018 may be used to send and receive network traffic such as data packets. In a particular embodiment, communication interfaces 1018 comprise one or more physical NICs. These NICs may enable communication between any suitable element of platform logic 1010 (e.g., CPUs 1012 or memory 1014) and another device coupled to network 1008 (e.g., elements of other platforms or remote computing devices coupled to network 1008 through one or more networks).

Platform logic 1010 may receive and perform any suitable types of workloads. A workload may include any request to utilize one or more resources of platform logic 1010, such as one or more cores or associated logic. For example, a workload may comprise a request to instantiate a software component, such as an I/O device driver 1024 or guest system 1022; a request to process a network packet received from a virtual machine 1032 or device external to platform 1002A (such as a network node coupled to network 1008); a request to execute a process or thread associated with a guest system 1022, an application running on platform 1002A, a hypervisor 1020 or other operating system running on platform 1002A; or other suitable processing request.

A virtual machine 1032 may emulate a computer system with its own dedicated hardware. A virtual machine 1032 may run a guest operating system on top of the hypervisor

1020. The components of platform logic 1010 (e.g., CPUs 1012, memory 1014, chipset 1016, and communication interface 1018) may be virtualized such that it appears to the guest operating system that the virtual machine 1032 has its own dedicated components.

A virtual machine 1032 may include a virtualized NIC (vNIC), which is used by the virtual machine as its network interface. A vNIC may be assigned a media access control (MAC) address or other identifier, thus allowing multiple virtual machines 1032 to be individually addressable in a network.

VNF 1034 may comprise a software implementation of a functional building block with defined interfaces and behavior that can be deployed in a virtualized infrastructure. In particular embodiments, a VNF 1034 may include one or more virtual machines 1032 that collectively provide specific functionalities (e.g., WAN optimization, virtual private network (VPN) termination, firewall operations, load balancing operations, security functions, etcetera). A VNF 1034 running on platform logic 1010 may provide the same functionality as traditional network components implemented through dedicated hardware. For example, a VNF 1034 may include components to perform any suitable network function virtualization (NFV) workloads, such as virtualized evolved packet core (vEPC) components, mobility management entities, 3rd Generation Partnership Project (3GPP) control and data plane components, etc.

SFC 1036 is a group of VNFs 1034 organized as a chain to perform a series of operations, such as network packet processing operations. Service function chaining may provide the ability to define an ordered list of network services (e.g. firewalls, load balancers) that are stitched together in the network to create a service chain.

A hypervisor 1020 (also known as a virtual machine monitor) may comprise logic to create and run guest systems 1022. The hypervisor 1020 may present guest operating systems run by virtual machines with a virtual operating platform (i.e., it appears to the virtual machines that they are running on separate physical nodes when they are actually consolidated onto a single hardware platform) and manage the execution of the guest operating systems by platform logic 1010. Services of hypervisor 1020 may be provided by virtualizing in software or through hardware assisted resources that require minimal software intervention, or both. Multiple instances of a variety of guest operating systems may be managed by the hypervisor 1020. Each platform 1002 may have a separate instantiation of a hypervisor 1020.

Hypervisor 1020 may be a native or bare metal hypervisor that runs directly on platform logic 1010 to control the platform logic and manage the guest operating systems. Alternatively, hypervisor 1020 may be a hosted hypervisor that runs on a host operating system and abstracts the guest operating systems from the host operating system. Hypervisor 1020 may include a virtual switch 1038 that may provide virtual switching and/or routing functions to virtual machines of guest systems 1022. The virtual switch 1038 may comprise a logical switching fabric that couples the vNICs of the virtual machines 1032 to each other, thus creating a virtual network through which virtual machines may communicate with each other.

Virtual switch 1038 may comprise a software element that is executed using components of platform logic 1010. In various embodiments, hypervisor 1020 may be in communication with any suitable entity (e.g., an SDN controller) which may cause hypervisor 1020 to reconfigure the parameters of virtual switch 1038 in response to changing conditions in platform 1002 (e.g., the addition or deletion of virtual machines 1032 or identification of optimizations that may be made to enhance performance of the platform).

Hypervisor 1020 may also include resource allocation logic 1044, which may include logic for determining allocation of platform resources based on the telemetry data (which may include stress information). Resource allocation logic 1044 may also include logic for communicating with various components of platform logic 1010 entities of platform 1002A to implement such optimization, such as components of platform logic 1010.

Any suitable logic may make one or more of these optimization decisions. For example, system management platform 1006; resource allocation logic 1044 of hypervisor 1020 or other operating system; or other logic of computer platform 1002A may be capable of making such decisions. In various embodiments, the system management platform 1006 may receive telemetry data from and manage workload placement across multiple platforms 1002. The system management platform 1006 may communicate with hypervisors 1020 (e.g., in an out-of-band manner) or other operating systems of the various platforms 1002 to implement workload placements directed by the system management platform.

The elements of platform logic 1010 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, or a GTL bus.

Elements of the computer platform 1002A may be coupled together in any suitable manner such as through one or more networks 1008. A network 1008 may be any suitable network or combination of one or more networks operating using one or more suitable networking protocols. A network may represent a series of nodes, points, and interconnected communication paths for receiving and transmitting packets of information that propagate through a communication system. For example, a network may include one or more firewalls, routers, switches, security appliances, antivirus servers, or other useful network devices.

FIG. 11 is a block diagram of a rack scale design 1100. Embodiments of rack scale design 1100 disclosed herein may be adapted or configured to provide a variable impedance communication terminal, according to the teachings of the present specification.

In this example, RSD 1100 includes a single rack 1104, to illustrate certain principles of RSD. It should be understood that RSD 1100 may include many such racks, and that the racks need not be identical to one another. In some cases, a multipurpose rack such as rack 1104 may be provided, while in other examples, single-purpose racks may be provided. For example, rack 1104 may be considered a highly inclusive rack that includes resources that may be used to allocate a large number of composite nodes. On the other hand, other examples could include a rack dedicated solely to compute sleds, storage sleds, memory sleds, and other resource types, which together can be integrated into composite nodes. Thus, rack 1104 of FIG. 11 should be understood to be a nonlimiting example of a rack that may be used in an RSD 1100.

In the example of FIG. 11, rack 1104 may be a standard rack with an external width of approximately 23.6 inches and a height of 78.74 inches. In common usage, this is referred to as a "42U rack." However, rack 1104 need not conform to the "rack unit" standard. Rather, rack 1104 may include a number of chassis that are optimized for their purposes.

Rack 1104 may be marketed and sold as a monolithic unit, with a number of LRUs within each chassis. The LRUs in this case may be sleds, and thus can be easily swapped out when a replacement needs to be made.

In this example, rack 1104 includes a power chassis 1110, a storage chassis 1116, three compute chassis (1124-1, 1124-2, and 1124-3), a 3-D Crosspoint™ (3DXP) chassis 1128, an accelerator chassis 1130, and a networking chassis 1134. Each chassis may include one or more LRU sleds holding the appropriate resources. For example, power chassis 1110 includes a number of hot pluggable power supplies 1112, which may provide shared power to rack 1104. In other embodiments, some sled chassis may also include their own power supplies, depending on the needs of the embodiment.

Storage chassis 1116 includes a number of storage sleds 1118. Compute chassis 1124 each contain a number of compute sleds 1120. 3DXP chassis 1128 may include a number of 3DXP sleds 1126, each hosting a 3DXP memory server. And accelerator chassis 1130 may host a number of accelerators, such as Intel® Quick Assist™ technology (QAT), FPGAs, ASICs, or other accelerators of the same or different types. Accelerators within accelerator chassis 1130 may be the same type or of different types according to the needs of a particular embodiment.

Over time, the various LRUs within rack 1104 may become damaged, outdated, or may experience functional errors. As this happens, LRUs may be pulled and replaced with compatible LRUs, thus allowing the rack to continue full scale operation.

Figure 12:
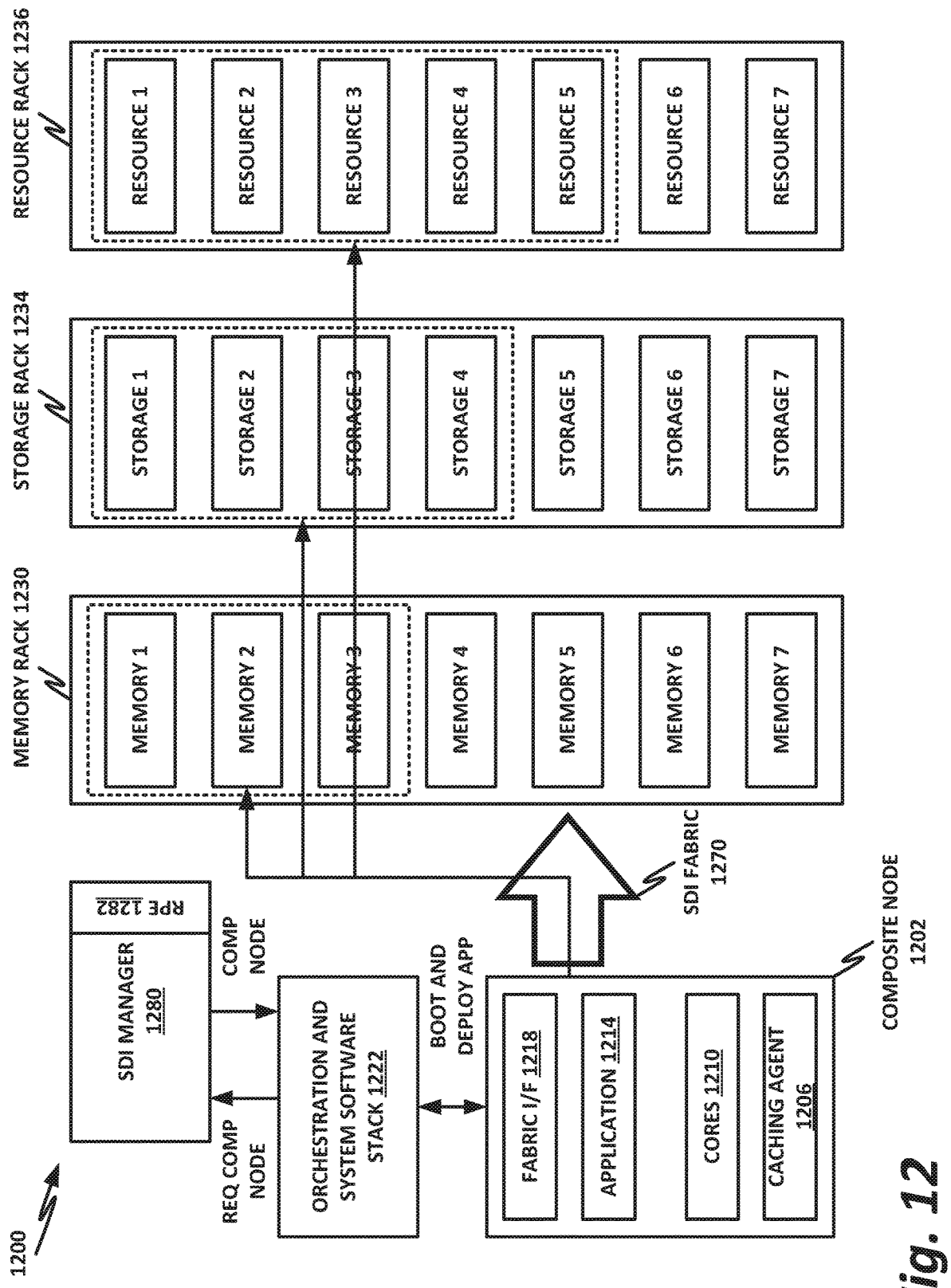
FIG. 12 is a block diagram of a software-defined infrastructure (SDI) data center, according to the teachings of the present specification.

FIG. 12 is a block diagram of a software-defined infrastructure (SDI) data center 1200. Embodiments of SDI 1200 disclosed herein may be adapted or configured to provide a variable impedance communication terminal, according to the teachings of the present specification.

Certain applications hosted within SDI data center 1200 may employ a set of resources to achieve their designated purposes, such as processing database queries, serving web pages, or providing computer intelligence.

Certain applications tend to be sensitive to a particular subset of resources. For example, SAP HANA is an in-memory, column-oriented relational database system. A SAP HANA database may use processors, memory, disk, and fabric, while being most sensitive to memory and processors. In one embodiment, composite node 1202 includes one or more cores 1210 that perform the processing function. Node 1202 may also include caching agents 1206 that provide access to high-speed cache. One or more applications 1214 run on node 1202, and communicate with the SDI fabric via fabric interface 1218. Dynamically provisioning resources to node 1202 may include selecting a set of resources and ensuring that the quantities and qualities provided meet required performance indicators, such as service level agreements (SLAB) and quality of service (QoS). Resource selection and allocation for application 1214 may be performed by a resource manager, which may be implemented within orchestration and system software stack 1222. By way of nonlimiting example, throughout this specification the resource manager may be treated as though it can be implemented separately or by an orchestrator. Note that many different configurations are possible.

In an SDI data center, applications may be executed by a composite node such as node 1202 that is dynamically allocated by SDI manager 1280. Such nodes are referred to as composite nodes because they are not nodes where all of the resources are necessarily collocated. Rather, they may include resources that are distributed in different parts of the data center, dynamically allocated, and virtualized to the specific application 1214.

In this example, memory resources from three memory sleds from memory rack 1230 are allocated to node 1202, storage resources from four storage sleds from storage rack 1234 are allocated, and additional resources from five resource sleds from resource rack 1236 are allocated to application 1214 running on composite node 1202. All of these resources may be associated to a particular compute sled and aggregated to create the composite node. Once the composite node is created, the operating system may be booted in node 1202, and the application may start running using the aggregated resources as if they were physically collocated resources. As described above, fabric interface 1218 may provide certain interfaces that enable this operation to occur seamlessly with respect to node 1202.

As a general proposition, the more memory and compute resources that are added to a database processor, the better throughput it can achieve. However, this is not necessarily true for the disk or fabric. Adding more disk and fabric bandwidth may not necessarily increase the performance of the SAP HANA database beyond a certain threshold.

SDI data center 1200 may address the scaling of resources by mapping an appropriate amount of offboard resources to the application based on application requirements provided by a user or network administrator or directly by the application itself. This may include allocating resources from various resource racks, such as memory rack 1230, storage rack 1234, and resource rack 1236.

In an example, SDI controller 1280 also includes a resource protection engine (RPE) 1282, which is configured to assign permission for various target resources to disaggregated compute resources (DRCs) that are permitted to access them. In this example, the resources are expected to be enforced by a network card servicing the target resource.

In certain embodiments, elements of SDI data center 1200 may be adapted or configured to operate with the disaggregated telemetry model of the present specification.

Figure 13:
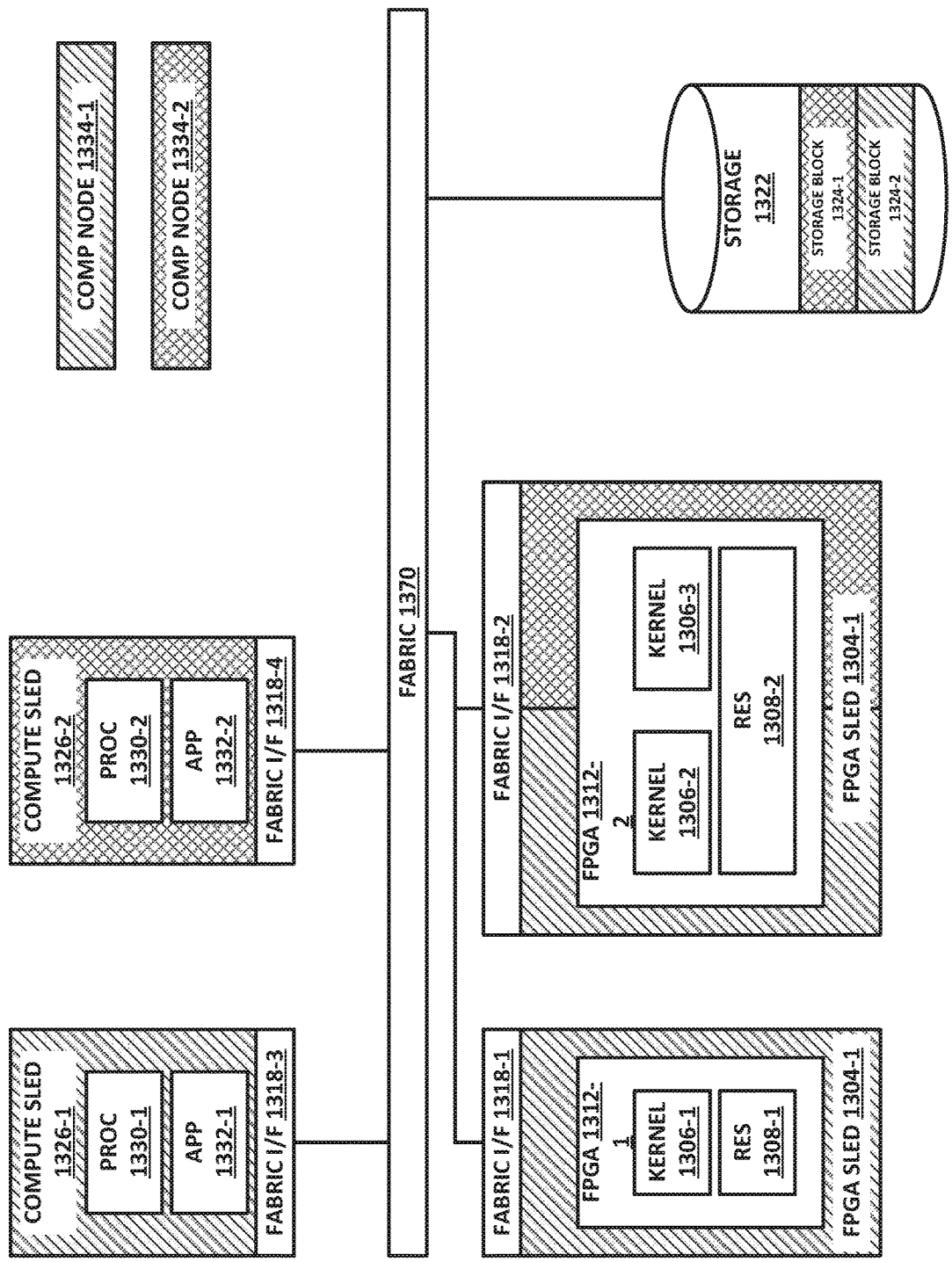
FIG. 13 is a block diagram of a data center that may be disaggregated, according to the teachings of the present specification.

FIG. 13 is a block diagram of a data center 1300 that may be disaggregated. Embodiments of data center 1300 disclosed herein may be adapted or configured to provide a variable impedance communication terminal, according to the teachings of the present specification.

In the example of FIG. 13, two composite nodes, namely composite node 1334-1 and composite node 1334-2 are defined.

Data center 1300 includes a number of resources that may be disaggregated and that may be defined as part of a composite node according to the teachings of the present specification. For example, compute sleds 1326-1 and 1326-2 each include a processor, respectively 1330-1 and 1330-2. Each processor 1330 may host a respective application, 1332-1 and 1332-2.

Note that in various embodiments, compute sleds 1326-1 may also provide local memory, storage, accelerators, or other resources for processor 1330-1. However, in accordance with the SDI teachings of the present specification, certain resources assigned to composite nodes 1334 may also be disaggregated, or physically remote from processors 1330. In this example, each composite node 1334 has assigned to it one or more FPGAs 1312 residing in FPGA sleds 1304. These FPGAs may provide an accelerated function operating at near hardware speeds, and provided by a kernel 1306. Each FPGA 1312 may also have access to certain local FPGA resources 1308. Composite node 1334 may also have access to storage blocks 1324 within storage sled 1322. Storage 1322 may also be a disaggregated resource provided in a resource sled.

It should be noted that, for simplicity and clarity of the illustration, only selected components are disclosed in this illustration. However, other disaggregated resources may also be provided. For example, data center 1300 may include a memory server providing disaggregated memory, including persistent fast memory, which composite nodes 1334 may access via RDMA.

In this example, composite node 1334-1 includes processor 1330-1 on compute sled 1326-1, running application 1332-1, and accessing fabric 1370 via fabric interface 1318-3. Composite node 1334-1 also includes FPGA 1312-1 running on FPGA sled 1304-1, running FPGA kernel 1306-1, and having access to FPGA resources 1308-1. FPGA sled 1304-1 may access fabric 1370 via fabric interface 1318-1. Note that in this example, a plurality of FPGAs on FPGA sled 1304-1 may be connected to one another via a passive backplane, and a single fabric interface 1318-1 may be provided for the entire sled. Composite node 1334-1 may also have access to storage block 1324-1 on storage sled 1322. Within FPGA sled 1304-2, FPGA 1312-2 has access to a shared resource 1308-2, which is accessed by two different kernels, kernel 1306-2 and kernel 1306-3. Kernel 1306-2 on FPGA 1312-1 is also assigned to composite node 1334-1, while kernel 1306-3 is not.

Composite node 1334-2 includes processor 1330-2 running application 1332-2 on compute sled 1326-2. Compute sled 1326-2 connects to fabric 1370 via fabric interface 1318-4. Note that compute sleds 1326 may also include a number of processors, memory, and other local resources that may be communicatively coupled to one another via a passive backplane, and share a common fabric interface 1318. Composite node 1334-2 also includes kernel 1306-3 running on shared FPGA 1312-2, and having access to shared resource 1308-2. Composite node 1334-2 may store data on storage block 1324-2.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

In the foregoing description, certain aspects of some or all embodiments are described in greater detail than is strictly necessary for practicing the appended claims. These details are provided by way of nonlimiting example only, for the purpose of providing context and illustration of the disclosed embodiments. Such details should not be understood to be required, and should not be "read into" the claims as limitations. The phrase may refer to "an embodiment" or "embodiments." These phrases, and any other references to embodiments, should be understood broadly to refer to any combination of one or more embodiments. Furthermore, the several features disclosed in a particular "embodiment" could just as well be spread across multiple embodiments. For example, if features 1 and 2 are disclosed in "an embodiment," embodiment A may have feature 1 but lack feature 2, while embodiment B may have feature 2 but lack feature 1.

This specification may provide illustrations in a block diagram format, wherein certain features are disclosed in separate blocks. These should be understood broadly to disclose how various features interoperate, but are not intended to imply that those features must necessarily be embodied in separate hardware or software. Furthermore, where a single block discloses more than one feature in the same block, those features need not necessarily be embodied in the same hardware and/or software. For example, a computer "memory" could in some circumstances be distributed or mapped between multiple levels of cache or local memory, main memory, battery-backed volatile memory, and various forms of persistent memory such as a hard disk, storage server, optical disk, tape drive, or similar. In certain embodiments, some of the components may be omitted or consolidated. In a general sense, the arrangements depicted in the figures may be more logical in their representations, whereas a physical architecture may include various permutations, combinations, and/or hybrids of these elements. Countless possible design configurations can be used to achieve the operational objectives outlined herein. Accordingly, the associated infrastructure has a myriad of substitute arrangements, design choices, device possibilities, hardware configurations, software implementations, and equipment options.

References may be made herein to a computer-readable medium, which may be a tangible and non-transitory computer-readable medium. As used in this specification and throughout the claims, a "computer-readable medium" should be understood to include one or more computer-readable mediums of the same or different types. A computer-readable medium may include, by way of nonlimiting example, an optical drive (e.g., CD/DVD/Blu-Ray), a hard drive, a solid-state drive, a flash memory, or other non-volatile medium. A computer-readable medium could also include a medium such as a ROM, an FPGA or ASIC configured to carry out the desired instructions, stored instructions for programming an FPGA or ASIC to carry out the desired instructions, an intellectual property (IP) block that can be integrated in hardware into other circuits, or instructions encoded directly into hardware or microcode on a processor such as a microprocessor, DSP, microcontroller, or in any other suitable component, device, element, or object where appropriate and based on particular needs. A non-transitory storage medium herein is expressly intended to include any non-transitory special-purpose or programmable hardware configured to provide the disclosed operations, or to cause a processor to perform the disclosed operations.

Various elements may be "communicatively," "electrically," "mechanically," or otherwise "coupled" to one another throughout this specification and the claims. Such coupling may be a direct, point-to-point coupling, or may include intermediary devices. For example, two devices may be communicatively coupled to one another via a controller that facilitates the communication. Devices may be electrically coupled to one another via intermediary devices such as signal boosters, voltage dividers, or buffers. Mechanically coupled devices may be indirectly mechanically coupled.

Any "module" or "engine" disclosed herein may refer to or include software, a software stack, a combination of hardware, firmware, and/or software, a circuit configured to carry out the function of the engine or module, or any computer-readable medium as disclosed above. Such modules or engines may, in appropriate circumstances, be provided on or in conjunction with a hardware platform, which may include hardware compute resources such as a processor, memory, storage, interconnects, networks and network interfaces, accelerators, or other suitable hardware. Such a hardware platform may be provided as a single monolithic device (e.g., in a PC form factor), or with some or part of the function being distributed (e.g., a "composite node" in a high-end data center, where compute, memory, storage, and other resources may be dynamically allocated and need not be local to one another).

There may be disclosed herein flow charts, signal flow diagram, or other illustrations showing operations being performed in a particular order. Unless otherwise expressly noted, or unless required in a particular context, the order should be understood to be a nonlimiting example only. Furthermore, in cases where one operation is shown to follow another, other intervening operations may also occur, which may be related or unrelated. Some operations may also be performed simultaneously or in parallel. In cases where an operation is said to be "based on" or "according to" another item or operation, this should be understood to imply that the operation is based at least partly on or according at least partly to the other item or operation. This should not be construed to imply that the operation is based solely or exclusively on, or solely or exclusively according to the item or operation.

All or part of any hardware element disclosed herein may readily be provided in an SoC, including a CPU package. An SoC represents an integrated circuit (IC) that integrates components of a computer or other electronic system into a single chip. Thus, for example, client devices or server devices may be provided, in whole or in part, in an SoC. The SoC may contain digital, analog, mixed-signal, and radio frequency functions, all of which may be provided on a single chip substrate. Other embodiments may include a multichip module (MCM), with a plurality of chips located within a single electronic package and configured to interact closely with each other through the electronic package.

In a general sense, any suitably-configured circuit or processor can execute any type of instructions associated with the data to achieve the operations detailed herein. Any processor disclosed herein could transform an element or an article (for example, data) from one state or thing to another state or thing. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein, should be construed as being encompassed within the broad terms "memory" and "storage," as appropriate.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high-level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. Any suitable processor and memory can be suitably coupled to the board based on particular configuration needs, processing demands, and computing designs. Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the specification, to limit this disclosure in any way that is not otherwise expressly reflected in the appended claims.

EXAMPLE IMPLEMENTATIONS

The following examples are provided by way of illustration.

Example 1 includes an integrated circuit, comprising: a network protocol circuit to provide communication via a network protocol; a network communication terminal having a configurable impedance; and a control circuit comprising a control input port, and circuitry to adjust the impedance of the network communication terminal responsive to an input signal.

Example 2 includes the integrated circuit of example 1, wherein the control circuitry comprises a register having a field to control an impedance of at least one of a transmit impedance or a receive impedance of the network communication terminal.

Example 3 includes the integrated circuit of example 2, wherein the register is an equalization coefficient register, and the field is a reserved field of the equalization coefficient register.

Example 4 includes the integrated circuit of example 2, wherein the field comprises a two-bit field to select from among up to four presets.

Example 5 includes the integrated circuit of example 2, wherein the field comprises an increment and decrement field.

Example 6 includes the integrated circuit of example 2, wherein the register is a dedicated register for impedance control.

Example 7 includes the integrated circuit of example 6, wherein the register comprises three impedance control fields, comprising a local setting, a remote setting, and an impedance request.

Example 8 includes the integrated circuit of example 2, wherein the register further comprises a flag indicating that the integrated circuit supports impedance control.

Example 9 includes the integrated circuit of example 1, wherein the network communication terminal has independent configurable send and receive impedances.

Example 10 includes the integrated circuit of example 1, wherein the network protocol circuit comprises a serializer-deserializer (SERDES).

Example 11 includes the integrated circuit of example 1, wherein the control circuit further comprises logic to determine that a link partner receive impedance can be changed to reduce inter-symbol interference (ISI), and to request the link partner to change its receive impedance.

Example 12 includes the integrated circuit of example 11, wherein requesting the link partner to change its receive impedance comprises causing an impedance sweep of available impedance pairings.

Example 13 includes the integrated circuit of example 11, wherein requesting the link partner to change its receive impedance comprises determining that an interconnect with the link partner is a high-loss interconnect, and maximizing difference between a transmit impedance of the integrated circuit and a receive impedance of the link partner.

Example 14 includes the integrated circuit of example 11, wherein requesting the link partner to change its receive impedance comprises determining that an interconnect with the link partner is a high-loss interconnect, and matching a transmit impedance of the integrated circuit and a receive impedance of the link partner.

Example 15 includes the integrated circuit of any of examples 1-14, wherein the network communication terminal comprises an Ethernet physical media attachment.

Example 16 includes the integrated circuit of any of examples 1-14, wherein the network protocol is Ethernet.

Example 17 includes the integrated circuit of any of examples 1-14, wherein the network protocol is selected from the group consisting of Ethernet, universal serial bus (USB), USB type C (USB-C), I2C, an on-die interconnect, and a coherent high-performance computing (HPC) fabric.

Example 18 includes an intellectual property block comprising the integrated circuit of any of examples 1-17.

Example 19 includes a system-on-a-chip (SoC) comprising the integrated circuit of any of examples 1-17.

Example 20 includes a system-on-a-board comprising the integrated circuit of any of examples 1-17.

Example 21 includes a rackmount server comprising a network interface card (NIC) comprising the integrated circuit of any of examples 1-17.

Example 22 includes a network interface device, comprising: a serializer-deserializer (SERDES) configured to provide communication via a network protocol; a network physical layer (PHY) comprising a communication terminal having a variable impedance element; and an impedance controller comprising a control input and logic to adjust the impedance of the network communication terminal responsive to an input.

Example 23 includes the network interface device of example 22, wherein the impedance controller comprises a register having an impedance control field for at least one of a transmit impedance or a receive impedance of the PHY.

Example 24 includes the network interface device of example 23, wherein the register is an equalization coefficient register, and the field is a reserved field of the equalization coefficient register.

Example 25 includes the network interface device of example 23, wherein the field comprises a two-bit field to select from among up to four presets.

Example 26 includes the network interface device of example 23, wherein the field comprises an increment and decrement field.

Example 27 includes the network interface device of example 23, wherein the register is a dedicated register for impedance control.

Example 28 includes the network interface device of example 23, wherein the register comprises three impedance control fields, comprising a local setting, a remote setting, and an impedance request.

Example 29 includes the network interface device of example 23, wherein the register further comprises a flag indicating that the integrated circuit supports impedance control.

Example 30 includes the network interface device of example 22, wherein the PHY has independent configurable send and receive impedances.

Example 31 includes the network interface device of example 22, wherein the network protocol circuit comprises a serializer-deserializer (SERDES).

Example 32 includes the network interface device of example 22, wherein the control circuit further comprises logic to determine that a link partner receive impedance can be changed to reduce inter-symbol interference (ISI), and to request the link partner to change its receive impedance.

Example 33 includes the network interface device of example 32, wherein requesting the link partner to change its receive impedance comprises causing an impedance sweep of available impedance pairings.

Example 34 includes the network interface device of example 32, wherein requesting the link partner to change its receive impedance comprises determining that an interconnect with the link partner is a high-loss interconnect, and maximizing difference between a transmit impedance of the integrated circuit and a receive impedance of the link partner.

Example 35 includes the network interface device of example 32, wherein requesting the link partner to change its receive impedance comprises determining that an interconnect with the link partner is a high-loss interconnect, and matching a transmit impedance of the integrated circuit and a receive impedance of the link partner.

Example 36 includes the network interface device of any of examples 22-35, wherein the network communication terminal comprises an Ethernet physical media attachment.

Example 37 includes the network interface device of any of examples 22-35, wherein the PHY is an Ethernet PHY.

Example 38 includes a system-on-a-chip (SoC) comprising the network interface device of any of examples 22-35.

Example 39 includes a system-on-a-board comprising the network interface device of any of examples 22-35.

Example 40 includes a rackmount server comprising the network interface device of any of examples 22-35.

Example 41 includes a method of configuring impedance for a network interface, comprising: communicatively coupling to a link partner via an interconnect; determining that inter-symbol interference (ISI) with the link partner can be reduced by changing impedance; and programming the impedance of a network physical layer (PHY) to reduce ISI.

Example 42 includes the method of example 41, wherein programming the impedance comprises manipulating a register having an impedance control field for at least one of a transmit impedance or a receive impedance of the PHY.

Example 43 includes the method of example 42, wherein the register is an equalization coefficient register, and the field is a reserved field of the equalization coefficient register.

Example 44 includes the method of example 42, wherein the field comprises a two-bit field to select from among up to four presets.

Example 45 includes the method of example 42, wherein the field comprises an increment and decrement field.

Example 46 includes the method of example 42, wherein the register is a dedicated register for impedance control.

Example 47 includes the method of example 42, wherein the register comprises three impedance control fields, comprising a local setting, a remote setting, and an impedance request.

Example 48 includes the method of example 42, wherein the register further comprises a flag indicating that the integrated circuit supports impedance control.

Example 49 includes the method of example 41, wherein the PHY has independent configurable send and receive impedances.

Example 50 includes the method of example 41, wherein the network protocol circuit comprises a serializer-deserializer (SERDES).

Example 51 includes the method of example 41, further comprising determining that a link partner receive impedance can be changed to reduce ISI, and requesting the link partner to change its receive impedance.

Example 52 includes the method of example 51, wherein requesting the link partner to change its receive impedance comprises causing an impedance sweep of available impedance pairings.

Example 53 includes the method of example 51, wherein requesting the link partner to change its receive impedance comprises determining that an interconnect with the link partner is a high-loss interconnect, and maximizing difference between a transmit impedance of the integrated circuit and a receive impedance of the link partner.

Example 54 includes the method of example 51, wherein requesting the link partner to change its receive impedance comprises determining that an interconnect with the link partner is a high-loss interconnect, and matching a transmit impedance of the integrated circuit and a receive impedance of the link partner.

Example 55 includes an apparatus comprising means to perform the method of any of examples 41-54.

Example 56 includes an integrated circuit comprising the apparatus of example 55.

Example 57 includes a system-on-a-chip comprising the apparatus of example 55.

Example 58 includes a system-on-a-board comprising the apparatus of example 55.

Example 59 includes an intellectual property block comprising the apparatus of example 55.

Example 60 includes a rackmount server comprising the apparatus of example 55.

Example 61 includes a network management entity comprising: a processor; and one or more computer-readable mediums having stored thereon instructions to instruct the processor to: determine that a first link partner and a second link partner on an interconnect have poorly matched transmit or receive impedances; and instruct at least one of the link partners to adjust its transmit or receive impedance to improve communication.

Example 62 includes the network management entity of example 61, wherein instructing at least one of the link partners comprises determining that the interconnect is a high-loss interconnect, and instructing the first link partner to increase its transmit impedance.

Example 63 includes the network management entity of example 61, wherein instructing at least one of the link partners comprises determining that the interconnect is a high-loss interconnect, and instructing the second link partner to decrease its receive impedance.

Example 64 includes the network management entity of example 61, wherein instructing at least one of the link partners comprises determining that the interconnect is a low-loss interconnect, and instructing the first and second link partners to substantially match their transmit and receive impedances.

Example 65 includes the network management entity of example 61, wherein instructing at least one of the link partners comprises: instructing the first link partner to assume a first impedance from among a finite set of preset impedances; instructing the second link partner to assume a second impedance from among a finite set of preset impedances; observing, for the combination of the first impedance and second impedance, a figure of merit or bit error rate on the interconnect; comparing the figure of merit or bit error rate of the interconnect to an existing baseline; and recording the figure of merit or bit error rate of the combination as a new baseline if it is better than the existing baseline.

Example 66 includes the network management entity of example 65, wherein instructing at least one of the link partners further comprises sweeping all combinations of link combinations in the finite set of preset impedances.

What is claimed is:

1. An integrated circuit, comprising:
    a network protocol circuit to provide communication via a network protocol;
    a network communication terminal having a configurable impedance;
    a control circuit comprising a control input port, and circuitry to adjust the impedance of the network communication terminal responsive to an input signal, and an impedance control register or registers, comprising a local impedance field to control a local transmit or receive impedance, a remote impedance field to store a transmit or receive impedance for a partner, and an impedance request field to receive a transmit or receive impedance request from another device.

2. The integrated circuit of claim 1, wherein the register or registers comprise an equalization coefficient register, including a reserved field of the equalization coefficient register.

3. The integrated circuit of claim 1, wherein the register or registers comprise a two-bit field to select from among up to four presets.

4. The integrated circuit of claim 1, wherein the register or registers comprise an increment and decrement field.

5. The integrated circuit of claim 1, wherein the register or registers comprise a dedicated register for impedance control.

6. The integrated circuit of claim 1, wherein the register or registers further comprise a flag indicating that the integrated circuit supports impedance control.

7. The integrated circuit of claim 1, wherein the network communication terminal has independent configurable send and receive impedances.

8. The integrated circuit of claim 1, wherein the network protocol circuit comprises a serializer-deserializer (SERDES).

9. The integrated circuit of claim 1, wherein the control circuit further comprises logic to determine that a link partner receive impedance can be changed to reduce inter-symbol interference (ISI), and to request the link partner to change its receive impedance.

10. The integrated circuit of claim 9, wherein requesting the link partner to change its receive impedance comprises causing an impedance sweep of available impedance pairings.

11. The integrated circuit of claim 9, wherein requesting the link partner to change its receive impedance comprises determining that an interconnect with the link partner is a high-loss interconnect, and maximizing difference between a transmit impedance of the integrated circuit and a receive impedance of the link partner.

12. The integrated circuit of claim 9, wherein requesting the link partner to change its receive impedance comprises determining that an interconnect with the link partner is a high-loss interconnect, and matching a transmit impedance of the integrated circuit and a receive impedance of the link partner.

13. The integrated circuit of claim 1, wherein the network protocol is Ethernet.

14. A system-on-a-chip (SoC) comprising the integrated circuit of claim 1.

15. A system-on-a-board comprising the integrated circuit of claim 1.

16. A network interface card (NIC) comprising the integrated circuit of claim 1.

17. A network interface device, comprising:
an Ethernet serializer-deserializer (SERDES) configured to provide communication via a network protocol;
a network physical layer (PHY) comprising a network communication terminal having a variable impedance element;
an impedance controller comprising a control input and logic to adjust the variable impedance element of the network communication terminal responsive to an input; and
logic to request a link partner to perform an impedance sweep to reduce inter-symbol interference (ISI).

18. The network interface device of claim 17, wherein the impedance controller comprises a register having an impedance control field for at least one of a transmit impedance or a receive impedance of the PHY.

19. The network interface device of claim 18, wherein the register is an equalization coefficient register, and the impedance control field is a reserved field of the equalization coefficient register.

20. The network interface device of claim 17, wherein the control input further comprises logic to determine that a link partner receive impedance can be changed to reduce inter-symbol interference (ISI), and to request the link partner to change its receive impedance comprising requesting the link partner to perform an impedance sweep.

21. The network interface device of claim 20, wherein requesting the link partner to change its receive impedance comprises determining that an interconnect with the link partner is a high-loss interconnect, and maximizing difference between a transmit impedance of the integrated circuit and a receive impedance of the link partner.

22. A network management entity comprising:
a processor; and
one or more computer-readable mediums having stored thereon instructions to instruct the processor to:
provide communication via a network protocol;
determine that a first link partner and a second link partner on an interconnect have poorly matched transmit or receive impedances; and
instruct at least one of the link partners to adjust its transmit or receive impedance to improve communication, comprising writing a value to an impedance control register of the at least one link partner.

23. The network management entity of claim 22, wherein instructing at least one of the link partners comprises:
instructing the first link partner to assume a first impedance from among a finite set of preset impedances;
instructing the second link partner to assume a second impedance from among a finite set of preset impedances;
observing, for a combination of the first impedance and second impedance, a figure of merit or bit error rate of the interconnect;
comparing the figure of merit or bit error rate of the interconnect to an existing baseline; and
recording the figure of merit or bit error rate of the combination as a new baseline if it is better than the existing baseline.

24. The network management entity of claim 22, wherein the network protocol is Ethernet.

* * * * *